United States Patent
Liu et al.

(10) Patent No.: US 12,532,580 B2
(45) Date of Patent: Jan. 20, 2026

(54) LIGHT-EMITTING DEVICE, PIXEL CIRCUIT, LIGHT-EMITTING SUBSTRATE AND DISPLAY APPARATUS

(71) Applicant: BOE TECHNOLOGY GROUP CO., LTD., Beijing (CN)

(72) Inventors: Weixing Liu, Beijing (CN); Kuanjun Peng, Beijing (CN); Xiaolong Li, Beijing (CN); Wanpeng Teng, Beijing (CN); Bin Qin, Beijing (CN); Wanzhi Chen, Beijing (CN); Fangzhen Zhang, Beijing (CN); Chunfang Zhang, Beijing (CN); Zhiqiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 776 days.

(21) Appl. No.: 17/789,351

(22) PCT Filed: May 31, 2021

(86) PCT No.: PCT/CN2021/097478
§ 371 (c)(1),
(2) Date: Jun. 27, 2022

(87) PCT Pub. No.: WO2022/252077
PCT Pub. Date: Dec. 8, 2022

(65) Prior Publication Data
US 2024/0186454 A1 Jun. 6, 2024

(51) Int. Cl.
*H01L 33/38* (2010.01)
*G09G 3/32* (2016.01)
(Continued)

(52) U.S. Cl.
CPC .......... *H10H 20/8312* (2025.01); *G09G 3/32* (2013.01); *H01L 25/0753* (2013.01);
(Continued)

(58) Field of Classification Search
CPC ............. H10H 20/8312; H10H 20/857; H10H 20/819; H10H 20/831; H10H 29/10;
(Continued)

(56) References Cited

U.S. PATENT DOCUMENTS

2021/0126154 A1* 4/2021 Kim ..................... H10H 20/857
2021/0408103 A1 12/2021 Dai et al.
(Continued)

FOREIGN PATENT DOCUMENTS

| CN | 110047425 A | 7/2019 |
| CN | 110190084 A | 8/2019 |

(Continued)

*Primary Examiner* — Ermias T Woldegeorgis
(74) *Attorney, Agent, or Firm* — XSENSUS LLP

(57) ABSTRACT

A light-emitting device includes a first semiconductor layer, a light-emitting functional layer and a second semiconductor layer that are stacked. The first semiconductor layer includes a first semiconductor pattern and a second semiconductor pattern. The light-emitting functional layer includes a first light-emitting pattern and a second light-emitting pattern spaced apart. The second semiconductor layer includes a third semiconductor pattern and a fourth semiconductor pattern spaced apart. Orthographic projections of the first semiconductor pattern, the first light-emitting pattern and the third semiconductor pattern on a reference plane at least partially overlap to form a first light-emitting portion. Orthographic projections of the second semiconductor pattern, the second light-emitting pattern and the fourth semiconductor pattern on the reference plane at least partially overlap to
(Continued)

form a second light-emitting portion. The reference plane is parallel to a plane where the first semiconductor layer is located.

17 Claims, 8 Drawing Sheets

(51) Int. Cl.
 *H01L 25/075* (2006.01)
 *H10H 20/831* (2025.01)
 *H10H 20/857* (2025.01)
(52) U.S. Cl.
 CPC ............ *H10H 20/857* (2025.01); *G09G 2300/0819* (2013.01); *G09G 2300/0852* (2013.01); *G09G 2320/0626* (2013.01); *G09G 2330/021* (2013.01)
(58) Field of Classification Search
 CPC .......... H10H 29/142; G09G 3/32; G09G 2300/0819; G09G 2300/0852; G09G 2320/0626; G09G 2330/021; H01L 25/0753
 See application file for complete search history.

(56) References Cited

U.S. PATENT DOCUMENTS

2022/0310011 A1* 9/2022 Chen .................... G09G 3/2022
2022/0383799 A1 12/2022 Liu et al.

FOREIGN PATENT DOCUMENTS

| CN | 110246459 | A | | 9/2019 | |
|---|---|---|---|---|---|
| CN | 111312158 | A | * | 6/2020 | ........... G09G 3/2007 |
| CN | 111769108 | A | | 10/2020 | |
| CN | 112701136 | A | * | 4/2021 | ....... H01L 21/76895 |
| KR | 10-2015-0082946 | A | | 7/2015 | |

* cited by examiner

LIGHT-EMITTING DEVICE, PIXEL CIRCUIT, LIGHT-EMITTING SUBSTRATE AND DISPLAY APPARATUS

CROSS-REFERENCE TO RELATED APPLICATION

This application is a national phase entry under 35 USC 371 of International Patent Application No. PCT/CN2021/097478, filed on May 31, 2021, which is incorporated herein by reference in its entirety.

TECHNICAL FIELD

The present disclosure relates to the field of display technologies, and in particular, to a light-emitting device, a pixel circuit, a light-emitting substrate and a display apparatus.

BACKGROUND

Tiny light-emitting diodes (LEDs) such as micro LEDs and mini LEDs are reduced in size by adopting a miniature, array and thin-film structure. Compared with organic light-emitting diodes (OLEDs), the tiny LEDs have advantages such as high brightness, high luminous efficiency and low power consumption. Moreover, the tiny LEDs are made of an inorganic light-emitting material with better stability and higher reliability, and are becoming a new generation of display technology.

SUMMARY

In an aspect, a light-emitting device is provided. The light-emitting device includes a first semiconductor layer, a light-emitting functional layer and a second semiconductor layer that are stacked. The first semiconductor layer includes a first semiconductor pattern and a second semiconductor pattern. The light-emitting functional layer is disposed on one of two opposite sides of the first semiconductor layer in a thickness direction of the first semiconductor layer. The light-emitting functional layer includes a first light-emitting pattern and a second light-emitting pattern spaced apart. The second semiconductor layer is disposed on a side of the light-emitting functional layer away from the first semiconductor layer. The second semiconductor layer includes a third semiconductor pattern and a fourth semiconductor pattern spaced apart. Orthographic projections of the first semiconductor pattern, the first light-emitting pattern and the third semiconductor pattern on a reference plane at least partially overlap to form a first light-emitting portion. Orthographic projections of the second semiconductor pattern, the second light-emitting pattern and the fourth semiconductor pattern on the reference plane at least partially overlap to form a second light-emitting portion. The reference plane is parallel to a plane where the first semiconductor layer is located.

In some embodiments, the light-emitting device further includes an electrode layer. The electrode layer is disposed on a side of the second semiconductor layer away from the first semiconductor layer. The electrode layer includes a first electrode and a second electrode spaced apart. The first electrode is electrically connected to the third semiconductor pattern. The second electrode is electrically connected to the fourth semiconductor pattern.

In some embodiments, the light-emitting device further includes a passivation layer. The passivation layer is disposed between the second semiconductor layer and the electrode layer. The passivation layer is provided with a first via hole and a second via hole therein. The first electrode is electrically connected to the third semiconductor pattern through the first via hole. The second electrode is electrically connected to the fourth semiconductor pattern through the second via hole.

In some embodiments, the light-emitting device further includes at least one insulating layer and a bonding electrode layer. The at least one insulating layer is disposed on a side of the electrode layer away from the first semiconductor layer. The at least one insulating layer is provided with a third via hole and a fourth via hole therein. The bonding electrode layer is disposed on a side of the at least insulating layer away from the electrode layer. The bonding electrode layer includes a first bonding electrode and a second bonding electrode. The first bonding electrode is electrically connected to the first electrode through the third via hole. The second bonding electrode is electrically connected to the second electrode through the fourth via hole.

In some embodiments, the at least one insulating layer is further provided with at least one fifth via hole therein. The bonding electrode layer further includes a third bonding electrode. The third bonding electrode is electrically connected to the first semiconductor pattern and the second semiconductor pattern through the at least one fifth via hole.

In some embodiments, the first semiconductor pattern is electrically connected to the second semiconductor pattern. The first semiconductor pattern and the second semiconductor pattern are spaced apart or of a one-piece structure.

In some embodiments, the at least one insulating layer includes at least one of a reflective layer, a heat dissipation layer, and an encapsulation layer.

In some embodiments, the light-emitting device further includes a substrate. The first semiconductor layer is disposed on one of two opposite sides of the substrate in the thickness direction. The first semiconductor pattern and the second semiconductor pattern are disposed on the same substrate, and the light-emitting functional layer is disposed on a side of the first semiconductor layer away from the substrate.

In another aspect, a pixel circuit is provided. The pixel circuit is configured to drive the light-emitting device described in any one of the above embodiments, and includes a first control circuit and a second control circuit. The first control circuit is coupled to a first scanning signal terminal, a first data signal terminal, a first voltage signal terminal and the first light-emitting portion of the light-emitting device. The first control circuit is configured to, under control of a first scanning signal from the first scanning signal terminal and a first data signal from the first data signal terminal, control connection between the first voltage signal terminal and the first light-emitting portion, and control a luminance of the first light-emitting portion to be switched between a first gray scale and a second gray scale. The second control circuit is coupled to the first scanning signal terminal, the first voltage signal terminal, and the second light-emitting portion of the light-emitting device. The second control circuit is configured to, under control of the first scanning signal from the first scanning signal terminal, control connection between the first voltage signal terminal and the second light-emitting portion, and control a magnitude of a driving current flowing through the second light-emitting portion.

In some embodiments, the first control circuit includes a first data writing sub-circuit, a switch control sub-circuit and a first storage sub-circuit. The first data writing sub-circuit is coupled to the first scanning signal terminal, the first data signal terminal and a first node, and is configured to transmit the first data signal from the first data signal terminal to the first node under the control of the first scanning signal from the first scanning signal terminal. The switch control sub-circuit is coupled to the first node, the first voltage signal terminal and the first light-emitting portion, and is configured to control the connection between the first voltage signal terminal and the first light-emitting portion under control of a voltage of the first node. The first storage sub-circuit is coupled to the first voltage terminal and the first node, and is configured to store and maintain the voltage of the first node.

In some embodiments, the first data writing sub-circuit includes a first transistor. A control electrode of the first transistor is coupled to the first scanning signal terminal, a first electrode of the first transistor is coupled to the first data signal terminal, and a second electrode of the first transistor is coupled to the first node. The switch control sub-circuit includes a second transistor. A control electrode of the second transistor is coupled to the first node, a first electrode of the second transistor is coupled to the first voltage signal terminal, and a second electrode of the second transistor is coupled to the first light-emitting portion. The first storage sub-circuit includes a first storage capacitor. A first end of the first storage capacitor is coupled to the first node, and a second end of the first storage capacitor is coupled to the first voltage signal terminal.

In some embodiments, the second control circuit includes a second data writing sub-circuit, a second storage sub-circuit, a first driving sub-circuit, a compensation sub-circuit, a voltage control sub-circuit, a light-emitting control sub-circuit, and an initialization sub-circuit. The second data writing sub-circuit is coupled to the first scanning signal terminal, a second data signal terminal and a second node, and is configured to transmit a second data signal from the second data signal terminal to the second node under the control of the first scanning signal from the first scanning signal terminal. The second storage sub-circuit is coupled to the second node and a third node, and is configured to store a voltage of the second node and adjust a voltage of the third node. The first driving sub-circuit is coupled to the third node, the first voltage signal terminal and a fourth node, and is configured to transmit a driving current to the fourth node under control of the voltage of the third node and a first voltage signal from the first voltage signal terminal. The compensation sub-circuit is coupled to the first scanning signal terminal, the fourth node and the third node, and is configured compensate a threshold voltage of the first driving sub-circuit to the third node under the control of the first scanning signal from the first scanning signal terminal. The voltage control sub-circuit is coupled to a second scanning signal terminal, a second voltage signal terminal and the second node, and is configured to transmit a second voltage signal from the second voltage signal terminal to the second node under control of a second scanning signal from the second scanning signal terminal. The light-emitting control sub-circuit is coupled to an enable signal terminal, the fourth node and the second light-emitting portion, and is configured to transmit the driving current of the fourth node to the second light-emitting portion under control of an enable signal from the enable signal terminal. The initialization sub-circuit is coupled to a reset signal terminal, the second voltage signal terminal and the second node, and is configured to transmit the second voltage signal from the second voltage signal terminal to the second node under control of a reset signal from the reset signal terminal.

In some embodiments, the second data writing sub-circuit includes a third transistor. A control electrode of the third transistor is coupled to the first scanning signal terminal, a first electrode of the third transistor is coupled to the second data signal terminal, and a second electrode of the third transistor is coupled to the second node. The second storage sub-circuit includes a second storage capacitor. A first end of the second storage capacitor is electrically connected to the second node, and a second end of the second storage capacitor is electrically connected to the third node. The first driving sub-circuit includes a fourth transistor. A control electrode of the fourth transistor is coupled to the third node, a first electrode of the fourth transistor is coupled to the first voltage signal terminal, and a second electrode of the fourth transistor is coupled to the fourth node. The compensation sub-circuit includes a fifth transistor. A control electrode of the fifth transistor is coupled to the first scanning signal terminal, a first electrode of the fifth transistor is coupled to the fourth node, and a second electrode of the fifth transistor is coupled to the third node. The voltage control sub-circuit includes a sixth transistor. A control electrode of the sixth transistor is coupled to the second scanning signal terminal, a first electrode of the sixth transistor is coupled to the second voltage signal terminal, and a second electrode of the sixth transistor is coupled to the second node. The light-emitting control sub-circuit includes a seventh transistor. A control electrode of the seventh transistor is coupled to the enable signal terminal, a first electrode of the seventh transistor is coupled to the fourth node, and a second electrode of the seventh transistor is coupled to the second light-emitting portion. The reset sub-circuit includes an eighth transistor. A control electrode of the eighth transistor is coupled to the reset signal terminal, a first electrode of the eighth transistor is coupled to the second voltage signal terminal, and a second electrode of the eighth transistor is coupled to the second node.

In some embodiments, the second control circuit includes: a feedback sub-circuit, an input sub-circuit, a second driving sub-circuit, a third storage sub-circuit and a modulation sub-circuit. The feedback sub-circuit is coupled to the first scanning signal terminal, a feedback signal terminal and a feedback node, and is configured to transmit a voltage of the feedback node to the feedback signal terminal under the control of the first scanning signal from the first scanning signal terminal. The feedback node is coupled to the second light-emitting portion. The input sub-circuit is coupled to the first scanning signal terminal, an input signal terminal and a fifth node, and is configured to transmit an input signal from the input signal terminal to the fifth node under the control of the first scanning signal from the first scanning signal terminal. The input signal is generated according to the voltage of the feedback node and a third data signal for controlling a gray scale of the second light-emitting portion. The second driving sub-circuit is coupled to the fifth node, a sixth node and the feedback node, and is configured to adjust the voltage of the feedback node according to a voltage of the sixth node under control of a voltage of the fifth node. The third storage sub-circuit is coupled to the first voltage signal terminal and the fifth node, and is configured to store and maintain the voltage of the fifth node. The modulation sub-circuit is coupled to a third scanning signal terminal, the first voltage signal terminal and the sixth node, and is configured to, under control of a third scanning signal from the third scanning signal terminal, transmit the first voltage signal from the first voltage signal terminal to the sixth node, and modulate time of the connection between the first voltage signal terminal and the second light-emitting portion.

In some embodiments, the feedback sub-circuit includes a ninth transistor. A control electrode of the ninth transistor is coupled to the first scanning signal terminal, a first electrode of the ninth transistor is coupled to the feedback node, and a second electrode of the ninth transistor is coupled to the feedback signal terminal. The input sub-circuit includes a tenth transistor. A control electrode of the tenth transistor is coupled to the first scanning signal terminal, a first electrode of the tenth transistor is coupled to the input signal terminal, and a second electrode of the tenth transistor is coupled to the fifth node. The second driving sub-circuit includes an eleventh transistor. A control electrode of the eleventh transistor is coupled to the fifth node, a first electrode of the eleventh transistor is coupled to the sixth node, and a second electrode of the eleventh transistor is coupled to the feedback node. The third storage sub-circuit includes a third capacitor. A first end of the third capacitor is coupled to the first voltage signal terminal, and a second end of the third capacitor is coupled to the fifth node. The modulation sub-circuit includes a twelfth transistor. A control electrode of the twelfth transistor is coupled to the third scanning signal terminal, and a first electrode of the twelfth transistor is coupled to the first voltage signal terminal, and a second electrode of the twelfth transistor is coupled to the sixth node.

In yet another aspect, a light-emitting substrate is provided. The light-emitting panel includes a driving backplane and the light-emitting devices each described in any one of the above embodiments. The driving backplane includes a plurality of pixel circuits each described in any one of the above embodiments. A first control circuit of each pixel circuit is coupled to a first light-emitting portion of a light-emitting device, and a second control circuit of the pixel circuit is coupled to a second light-emitting portion of the light-emitting device.

In some embodiments, the second control circuit of the pixel circuit includes a feedback sub-circuit, an input sub-circuit, a second driving sub-circuit, a third storage sub-circuit and a modulation sub-circuit. The feedback sub-circuit is coupled to the first scanning signal terminal, a feedback signal terminal and a feedback node, and the feedback node is coupled to the second light-emitting portion. The input sub-circuit is coupled to the first scanning signal terminal, an input signal terminal and a fifth node. The second driving sub-circuit is coupled to the fifth node, a sixth node and the feedback node. The third storage sub-circuit is coupled to the first voltage signal terminal and the fifth node. The modulation sub-circuit is coupled to a third scanning signal terminal, the first voltage signal terminal and the sixth node. The light-emitting substrate further includes a circuit board coupled to the driving backplane. The circuit board includes a third control circuit. The third control circuit includes a comparing sub-circuit and a signal converting sub-circuit. The comparing sub-circuit is coupled to a third data signal terminal, the feedback signal terminal and a seventh node, and is configured to compare a voltage of the feedback node transmitted by the feedback signal terminal with a voltage of a third data signal from the third data signal terminal, and output an adjustment voltage to the seventh node according to a comparison result. The signal converting sub-circuit is coupled to the seventh node, a ground voltage terminal and the input signal terminal, and is configured to transmit an input signal to the input signal terminal according to the adjustment voltage of the seventh node and a voltage of the ground voltage terminal. The third data signal terminal is configured to transmit the third data signal for controlling a gray scale of the second light-emitting portion.

In some embodiments, the comparing sub-circuit includes a first amplifier. The first amplifier includes a first positive input terminal, a first negative input terminal and a first output terminal, the first positive input terminal is coupled to the feedback signal terminal, and the first negative input terminal is coupled to the third data signal terminal. The first output terminal is coupled to the seventh node.

The signal converting sub-circuit includes a second amplifier and a fourth capacitor. The second amplifier has a second positive input terminal, a second negative input terminal and a second output terminal. The second positive input terminal is coupled to the ground voltage terminal, the second negative input terminal is coupled to the seventh node, and the second output terminal is coupled to the signal input terminal. A first end of the fourth capacitor is coupled to the second negative input terminal, and a second end of the fourth capacitor is coupled to the second output terminal.

In some embodiments, the comparing sub-circuit further includes a first resistor. A first end of the first resistor is electrically connected to the first positive input terminal, and a second end of the first resistor is electrically connected to the first negative input terminal. The signal converting sub-circuit further includes a second resistor and a third resistor. A first end of the second resistor is electrically connected to the seventh node, and a second end of the second resistor is electrically connected to the second negative input terminal. A first end of the third resistor is electrically connected to the ground voltage terminal, and a second end of the third resistor is electrically connected to the second positive input terminal.

In yet another aspect, a display apparatus is provided. The display apparatus includes the light-emitting substrate described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
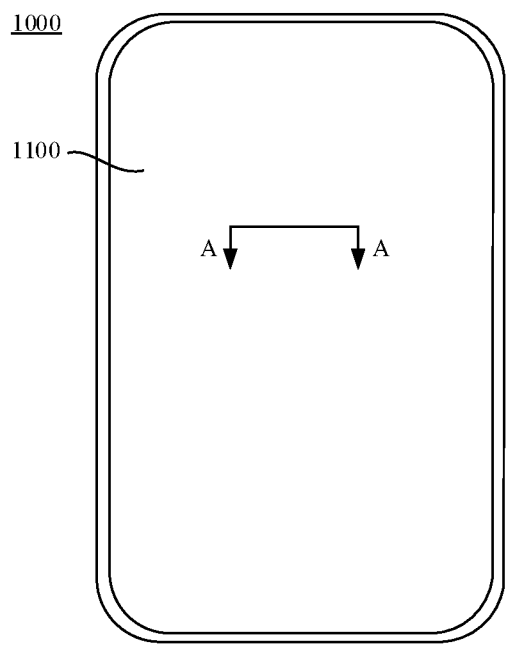
FIG. 1 is a schematic diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", or "example" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, unless otherwise specified, the term "a plurality of/the plurality of" means two or more.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" may also mean that two or more components are not in direct contact with each other, but still cooperate or interact with each other. The embodiments disclosed herein are not necessarily limited to the content herein.

The phrase "at least one of A, B and C" includes the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "configured to" as used herein indicates an open and inclusive expression, which does not exclude devices that are applicable to or configured to perform additional tasks or steps.

In addition, the phrase "based on" as used herein is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Transistors in a pixel circuit provided in embodiments of the present disclosure may be thin film transistors (TFTs), field effect transistors or other switch devices with the same properties. The embodiments of the present disclosure are described by taking the TFT as an example. The TFT may be a P-type transistor or an N-type transistor. The P-type transistor is turned on under an action of a low level and turned off under an action of a high level. The N-type transistor is turned on under an action of a high level and turned off under an action of a low level. The embodiments of the present disclosure are described by taking the P-type transistor as an example.

A control electrode of each TFT in the pixel circuit is a gate electrode of the TFT, a first electrode of the TFT is one of a source and a drain of the TFT, and a second electrode of the TFT is the other of the source and the drain of the TFT. Since the source and the drain of the TFT may be symmetrical in structure, the source and the drain thereof may be indistinguishable in structure. That is, the first electrode and the second electrode of the TFT in the embodiments of the present disclosure may be indistinguishable in structure. For example, the first electrode of the TFT is the source, and the second electrode of the TFT is the drain.

A first node, a second node and so forth in the pixel circuit do not represent actual components, but represent junctions of related electrical connections in a circuit diagram. That is, these nodes are nodes equivalent to the junctions of the related electrical connections in the circuit diagram.

Some embodiments of the present disclosure provide a display apparatus 1000. With reference to FIG. 1, the display apparatus 1000 may be any product or component with a display function, such as a television, a laptop computer, a tablet computer, a mobile phone, a personal digital assistant (PDA), a navigator, a wearable device, an augmented reality (AR) device, or a virtual reality (VR) device.

In some embodiments, the display apparatus 1000 includes a light-emitting substrate 1100, and the light-emitting substrate 1100 may be used as a backlight source or directly used to display an image.

Figure 2:
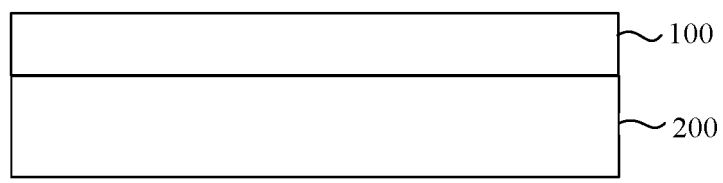
FIG. 2 is a sectional view taken along line A-A in FIG. 1.

With reference to FIG. 2, FIG. 2 is a sectional view of the light-emitting substrate 1100 in FIG. 1 taken along line A-A. The light-emitting substrate 1100 includes a plurality of light-emitting devices 100 and a driving backplane 200. The driving backplane 200 includes a plurality of pixel circuits for driving the plurality of light-emitting devices 100 to emit light, and each pixel circuit drives a light-emitting device 100.

In a case where the light-emitting substrate 1100 is used as the backlight source, the plurality of light-emitting devices 100 may emit light with the same color (approximately same wavelength). In addition, a color conversion layer (e.g., a color filter structural layer) may be provided on a light exit side of the light-emitting substrate 1100. The color of the light emitted from the light-emitting device 100 is converted by the color conversion layer, so as to form a color required to be displayed.

In a case where the light-emitting substrate 1100 is used to display an image, the plurality of light-emitting devices 100 may emit light with different colors, so that the light-emitting substrate 1100 is capable of displaying a color image. For example, the plurality of light-emitting devices 100 may include first light-emitting devices for emitting red light, second light-emitting devices for emitting green light, and third light-emitting devices for emitting blue light.

In some embodiments, the display apparatus 1000 may be a display apparatus including tiny light-emitting devices (such as mini light-emitting diodes (LEDs) or micro light-emitting diodes (LEDs)).

Figure 3:
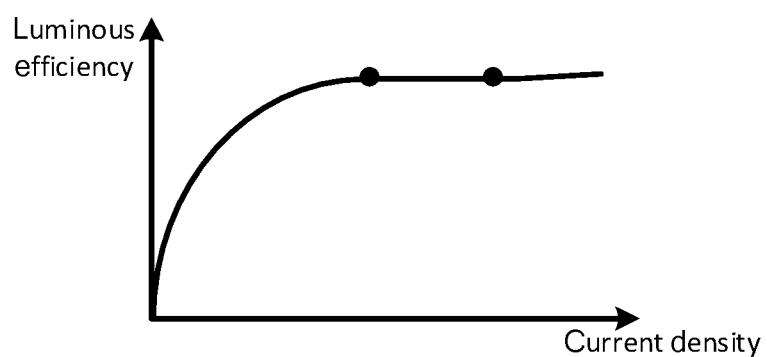
FIG. 3 is a diagram showing a relationship between luminous efficiency and current density of a light-emitting device.

With reference to FIG. 3, the tiny light-emitting device (micro LED) has properties of high luminous efficiency at a high current density and low luminous efficiency at a low current density, and the specific performance is as follows. When a density of a current (driving current) input to the tiny light-emitting device reaches a certain value, luminous efficiency of the tiny light-emitting device reaches the highest value; and before the current density reaches the certain value, the luminous efficiency of the tiny light-emitting device is in a climbing phase. That is, as the provided driving current increases, a luminance of the tiny light-emitting device gradually increases, and the luminous efficiency gradually increases.

In the related art, each light-emitting device includes one light-emitting portion. That is, each light-emitting device has one light-emitting region. A pixel circuit controls a magnitude of a driving current flowing through the light-emitting portion, so as to control a gray scale (luminance) displayed by the light-emitting portion. When the light-emitting device displays a low gray scale, the driving current flowing through the light-emitting device is small, the current density is small, and the luminous efficiency is low.

Figure 4A:
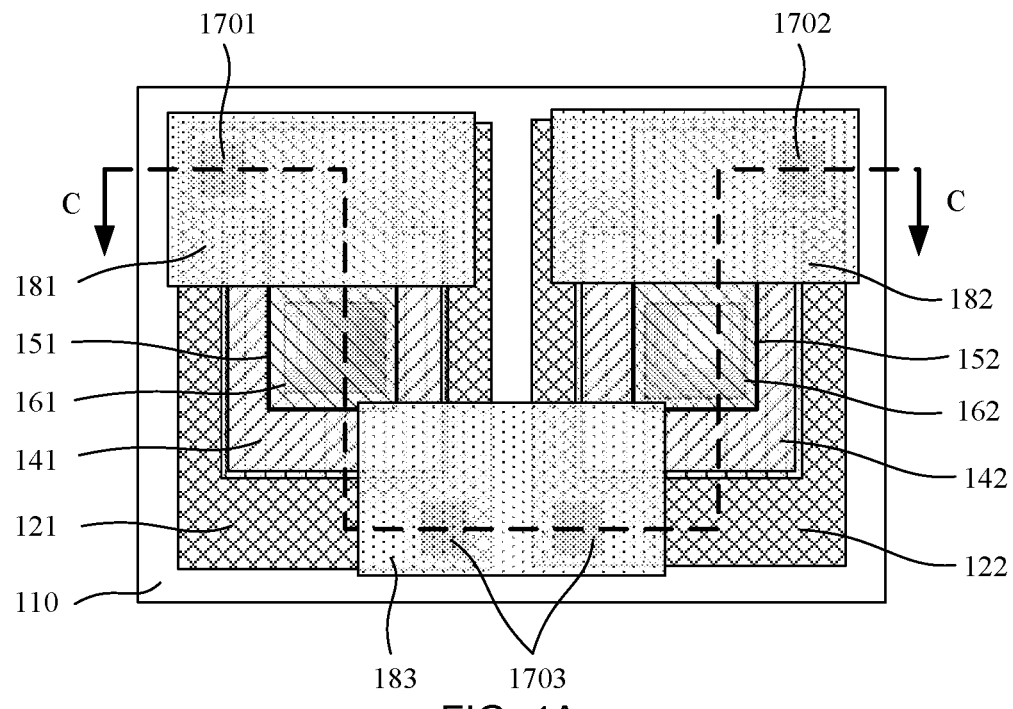
FIG. 4A is a partial enlarged view of a region where a light-emitting device is located in FIG. 1.
Figure 5A:
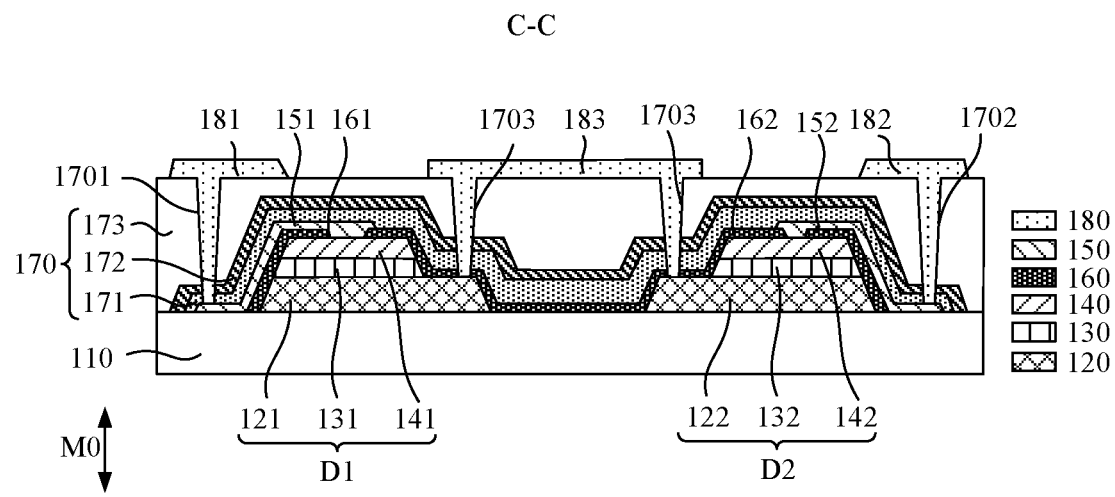
FIG. 5A is a sectional view taken along line C-C in FIG. 4A.

Some embodiments of the present disclosure provide a light-emitting device 100. With reference to FIGS. 4A and 5A, the light-emitting device 100 includes a first semiconductor layer 120, a light-emitting functional layer 130 and a second semiconductor layer 140 that are stacked.

The first semiconductor layer 120 includes a first semiconductor pattern 121 and a second semiconductor pattern 122.

The light-emitting functional layer 130 is disposed on one of two opposite sides of the first semiconductor layer 120 in a thickness direction M0 of the first semiconductor layer 120 (the vertical direction in FIG. 5A). FIG. 5A only exemplarily shows that the light-emitting functional layer 130 is disposed on an upper side of the first semiconductor layer 120. The light-emitting functional layer 130 includes a first light-emitting pattern 131 and a second light-emitting pattern 132 spaced apart. That is, there exists a gap between the first light-emitting pattern 131 and the second light-emitting pattern 132. As a result, the first light-emitting pattern 131 and the second light-emitting pattern 132 are able to form two separate light-emitting regions.

The second semiconductor layer 140 is disposed on a side of the light-emitting functional layer 130 away from the first semiconductor layer 120, and includes a third semiconductor pattern 141 and a fourth semiconductor pattern 142 spaced apart. That is, the third semiconductor pattern 141 is electrically insulated from the fourth semiconductor pattern 142. As a result, the third semiconductor pattern 141 and the fourth semiconductor pattern 142 are able to transmit different voltage signals.

For example, the first semiconductor layer 120 may be an N-type semiconductor (e.g., N-GaN) layer, and the second semiconductor layer 140 may be a P-type semiconductor (e.g., P-GaN) layer. A PN junction is formed between the first semiconductor pattern 121 and the third semiconductor pattern 141, and another PN junction is formed between the second semiconductor pattern 122 and the fourth semiconductor pattern 142. The light-emitting functional layer 130 may be a multiple quantum well (MQW) layer. In a case where the PN junctions with the potential barrier are formed between the first semiconductor layer and the second semiconductor layer, when minority carriers and majority carriers are recombined, extra energy is released in a form of light. In this way, electrical energy is directly converted into light energy.

Orthographic projections of the first semiconductor pattern 121, the first light-emitting pattern 131 and the third semiconductor pattern 141 on a reference plane at least partially overlap to form a first light-emitting portion D1. Orthographic projections of the second semiconductor pattern 122, the second light-emitting pattern 132, and the fourth semiconductor pattern 142 on the reference plane at least partially overlap to form a second light-emitting portion D2. The reference plane is parallel to a plane where the first semiconductor layer 120 is located.

When the first light-emitting portion D1 operates (emits light), voltage signals need to be input to the first semiconductor pattern 121 and the third semiconductor pattern 141, respectively; and there is a voltage difference between a voltage signal input to the first semiconductor pattern 121 and a voltage signal input to the third semiconductor pattern 141. When the second light-emitting portion D2 operates, voltage signals need to be input to the second semiconductor pattern 122 and the fourth semiconductor pattern 142, respectively; and there is a voltage difference between a voltage signal input to the second semiconductor pattern 122 and a voltage signal input to the fourth semiconductor pattern 142. For example, in a case where the first semiconductor layer 120 is the N-type semiconductor layer and the second semiconductor layer 140 is the P-type semiconductor layer, negative voltages may be respectively input to the first semiconductor pattern 121 and the second semiconductor pattern 122, and positive voltages may be respectively input to the third semiconductor pattern 141 and the fourth semiconductor pattern 142.

Since the third semiconductor pattern 141 and the fourth semiconductor pattern 142 are electrically insulated, same or different voltage signals may be input to the third semiconductor pattern 141 and the fourth semiconductor pattern 142. That is, the voltage difference between the third semiconductor pattern 141 and the first semiconductor pattern 121 may be the same as or different from the voltage difference between the fourth semiconductor pattern 142 and the second semiconductor pattern 122. The first light-emitting portion D1 and the second light-emitting portion D2 may operate separately, and display different gray scales. Based on this, when the light-emitting device 100 displays a low gray scale, one of the first light-emitting portion D1 and the second light-emitting portion D2 is controlled to operate, and the other does not operate. That is, the light-emitting device 100 displays the low gray scale through one light-emitting portion (i.e., the first light-emitting portion D1 or the second light-emitting portion D2). In this way, a light-emitting area of the light-emitting device 100 may be reduced when displaying the low gray scale. Compared with the related art, the light-emitting area of the light-emitting device 100 provided in the embodiments of the present disclosure is smaller when displaying the same low gray scale. In order to enable the light-emitting device 100 to display the same low gray scale, a current of the operated light-emitting portion needs to be increased, and thus a current density of the light-emitting portion is increased and the light-emitting efficiency of the light-emitting portion is improved.

For example, when the light-emitting device 100 displays the low gray scale, the first light-emitting portion D1 may be controlled to emit light, and the second light-emitting portion D2 does not emit light. In this way, an entire light-emitting area of the light-emitting device 100 may be reduced. Moreover, the light-emitting device 100 displays the corresponding gray scale by increasing the current of the first light-emitting portion D1, and thus the current density of the first light-emitting portion D1 is increased and the light-emitting efficiency of the first light-emitting portion D1 is improved. For another example, when the light-emitting device 100 displays the low gray scale, the second light-emitting portion D2 may be controlled to emit light, and the first light-emitting portion D1 does not emit light. The light-emitting device 100 displays the corresponding gray scale by increasing the current of the second light-emitting portion D2.

When the light-emitting device 100 needs to display a high gray scale, the first light-emitting portion D1 and the second light-emitting portion D2 operate simultaneously. The first light-emitting portion D1 and the second light-emitting portion D2 may display the same gray scale or different gray scales.

For example, the light-emitting device 100 is capable of displaying gray scales 0 to 255. The first light-emitting portion D1 is capable of displaying gray scales 0 to 127, and the second light-emitting portion D2 is capable of displaying gray scale 0 and gray scale 127. When the light-emitting device 100 needs to display the gray scales 0 to 127, the first light-emitting portion D1 operates separately, and the second light-emitting portion D2 does not operate. That is, the second light-emitting portion D2 displays the gray scale 0. By adjusting the driving current that flows through the first light-emitting portion D1, the gray scale displayed by the first light-emitting portion D1 is adjusted, so as to adjust the gray scale displayed by the light-emitting device 100. When the light-emitting device 100 needs to display gray scales 128 to 255, the first light-emitting portion D1 and the second light-emitting portion D2 operates simultaneously, and the second light-emitting portion D2 displays the gray scale 127. In this way, by adjusting the gray scale displayed by the first light-emitting portion D1, the gray scale displayed by the light-emitting device 100 is adjusted. For another example, the light-emitting device 100 is capable of displaying gray scales 0 to 255. The second light-emitting portion D2 is capable of displaying gray scales 0 to 127, and the first light-emitting portion D1 is capable of displaying gray scale 0 and gray scale 127. The operating processes of the first light-emitting portion D1 and the second light-emitting portion D may be referred to the above, and will not be repeated here.

In some embodiments, the first semiconductor pattern 121 and the second semiconductor pattern 122 are electrically connected, and the third semiconductor pattern 141 and the fourth semiconductor pattern 142 are configured to transmit different voltage signals. In this way, the first light-emitting portion D1 and the second light-emitting portion D2 may operate separately, and the light-emitting device 100 may display the low gray scale when one light-emitting portion operates, and display the high gray scale when the two light-emitting portions operate together.

In some embodiments, with reference to FIGS. 4A and 5A, the light-emitting device 100 further includes a substrate 110. The first semiconductor layer 120 is disposed on one of two opposite sides of the substrate 110 in the thickness direction M0. The first semiconductor pattern 121 and the second semiconductor pattern 122 are disposed on the same substrate 110, and the light-emitting functional layer 130 is located on a side of the first semiconductor layer 120 away from the substrate 110. That is, the substrate 110 is disposed on a side of the first semiconductor layer 120 away from the light-emitting functional layer 130. The first light-emitting portion D1 and the second light-emitting portion D2 belong to the same light-emitting device 100, and are both disposed on the same substrate 110. The light-emitting device 100 has two light-emitting portions that may operate separately.

The substrate 110 may be one of a sapphire ($Al_2O_3$) substrate, a silicon carbide (SiC) substrate, a silicon (Si) substrate, a gallium phosphide (GaP) substrate, or a gallium arsenide (GaAs) substrate.

During a process of manufacturing the light-emitting device 100, the first semiconductor layer 120, the light-emitting functional layer 130, the second semiconductor layer 140 are sequentially formed on the substrate 110 through epitaxy processes, and then other film layer(s) are formed on the second semiconductor layer 140, so as to form the light-emitting device 100. During a process of transferring the light-emitting device 100 to the driving backplane 200 to form the light-emitting substrate 1100, the substrate 110 may be peeled off (e.g., in a case where the micro LED is used to form the light-emitting substrate 1100, the substrate 110 may be peeled off from the micro LED), or the substrate 110 may be remained (e.g., in a case where the mini LED is used to form the light-emitting substrate 1100, the substrate 110 may be remained in the mini LED).

In some embodiments, with reference to FIGS. 4A and 5A, the light-emitting device 100 further includes an electrode layer 150. The electrode layer 150 is disposed on a side of the second semiconductor layer 140 away from the first semiconductor layer 120, and includes a first electrode 151 and a second electrode 152 spaced apart. That is, the first electrode 151 and the second electrode 152 are electrically insulated. The first electrode 151 is electrically connected to the third semiconductor pattern 141, and is configured to transmit a voltage signal to the third semiconductor pattern 141. The second electrode 152 is electrically connected to the fourth semiconductor pattern 142, and is configured to transmit a voltage signal to the fourth semiconductor pattern 142. For example, the electrode layer 150 may be a transparent conductive layer, such as an indium tin oxide (ITO) layer.

In some embodiments, with reference to FIGS. 4A and 5A, the light-emitting device 110 further includes a passivation layer 160. The passivation layer 160 is disposed between the second semiconductor layer 140 and the electrode layer 150. The passivation layer 160 is provided with a first via hole 161 and a second via hole 162 therein. The first electrode 151 is electrically connected to the third semiconductor pattern 141 through the first via hole 161, and the second electrode 152 is electrically connected to the fourth semiconductor pattern 142 through the second via hole 162. The first via hole 161 and the second via hole 162 may be the same in structure. The passivation layer 160 can separate the electrode layer 150 from the first semiconductor layer 120, and separate the electrode layer 150 from the light-emitting functional layer 130, so as to maintain the electrode layer 150 electrically insulated from both the first semiconductor layer 120 and the light-emitting functional layer 130. The voltage signal from the first electrode 151 may be transmitted to the third semiconductor pattern 141, and the voltage signal from the second electrode 152 may be transmitted to the fourth semiconductor pattern 142, so that both the first light-emitting portion D1 and the second light-emitting portion D2 may operate stably and separately.

In some embodiments, with reference to FIGS. 4A and 5A, the light-emitting device 100 further includes at least one insulating layer 170 and a bonding electrode layer 180. The at least one insulating layer 170 is disposed on a side of the electrode layer 150 away from the first semiconductor layer 120, and the bonding electrode layer 180 is disposed on a side of the at least one insulating layer 170 away from the electrode layer 150.

The at least one insulating layer 170 is provided with a third via hole 1701 and a fourth via hole 1702 therein. The bonding electrode layer 180 includes a first bonding electrode 181 and a second bonding electrode 182. The first bonding electrode 181 is electrically connected to the first electrode 151 through the third via hole 1701. The second bonding electrode 182 is electrically connected to the second electrode 152 through the fourth via hole 1702.

In the embodiments of the present disclosure, a surface of the electrode layer 150 away from the first semiconductor layer 120 is uneven, which is not conducive to bonding and electrically connecting the light-emitting device 100 to the pixel circuit of the driving backplane 200. A surface of the at least one insulating layer 170 away from the first semiconductor layer 120 is substantially flat, so that surfaces of the bonding electrodes (including the first bonding electrode 181 and the second bonding electrode 182) away from the first semiconductor layer 120 are flat, which is conducive to bonding and connecting the light-emitting device 100 to the driving backplane 200. As a result, stability and reliability of electrical connection between the light-emitting device 100 and the driving backplane 200 may be improved. Furthermore, the at least one insulating layer 170 may protect the electrode layer 150, so as to reduce erosion of the electrode layer 150 or to prevent the electrode layer 150 from being eroded.

In some embodiments, with reference to FIG. 5A, the at least one insulating layer 170 may include at least one of a reflective layer 171, a heat dissipation layer 172 and an encapsulation layer 173. For example, the at least one insulating layer 170 includes the reflective layer 171, the heat dissipation layer 172 and the encapsulation layer 173.

The reflective layer 171 may form a reflector in a substantially tapered shape on a side of the first light-emitting portion D1 and the second light-emitting portion D2 away from the substrate 110. Thus, the reflective layer 171 may reflect light, which is emitted by the first light-emitting portion D1 and the second light-emitting portion D2 and directed to the reflective layer 171, to a light exit side of the light-emitting device 100 (a side of the first light-emitting portion D1 and the second light-emitting portion D2 away from the bonding electrode layer 180), and then the light exits from the light exit side of the light-emitting device 100. As a result, the light-emitting efficiency of the light-emitting device 100 may be improved.

As the light-emitting device 100 operates for a long time, temperatures of the first light-emitting portion D1 and the second light-emitting portion D2 will gradually increase. With an increase in the temperatures, the luminous efficiency of the first light-emitting portion D1 and the second light-emitting portion D2 will decrease. The heat dissipation layer 172 may absorb heat generated by the first light-emitting portion D1 and the second light-emitting portion D2, and conduct the heat to an outside of the light-emitting device 100, which is conducive to reducing the operating temperatures of the first light-emitting portion D1 and the second light-emitting portion D2, and improving the luminous efficiency of the light-emitting device 100.

The encapsulation layer 173 may protect the reflective layer 171 and the heat dissipation layer 172. Moreover, the encapsulation layer 173 has a substantially flat surface, which is conducive to arranging the bonding electrode layer 180.

Figure 5B:
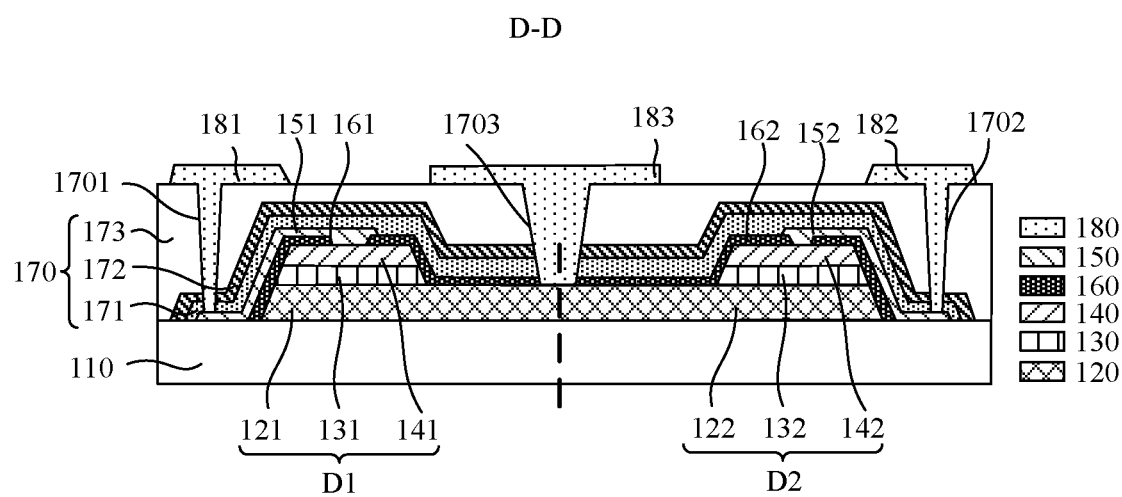
FIG. 5B is a sectional view taken along line D-D in FIG. 4B.

In some embodiments, with reference to FIGS. 4A and 5B, the at least one insulating layer 170 is further provide with at least one fifth via hole 1703 therein. In the case where the light-emitting device 100 includes the passivation layer 160, the least one fifth via hole 1703 further penetrates through the passivation layer 160. The bonding electrode layer 180 further includes a third bonding electrode 183, and the third bonding electrode 183 is electrically connected to the first semiconductor pattern 121 and the second semiconductor pattern 122 through the at least one fifth via hole 1703.

In some embodiments, the gray scale displayed by the light-emitting portion (the first light-emitting portion D1 or the second light-emitting portion D2) is related to the driving current flowing therethrough. The driving current flowing through the light-emitting portion is positively related to the voltage difference between the voltages input to the two semiconductor patterns of the light-emitting portion. In the case where the first semiconductor pattern 121 and the second semiconductor pattern 122 are electrically connected, the two light-emitting portions are controlled to operate separately by controlling the voltages input to the third semiconductor pattern 141 and the fourth semiconductor pattern 142. In this way, the pixel circuit of the driving backplane 200 may be simplified, thereby reducing difficulty of manufacturing the driving backplane 200, and reducing cost of manufacturing the driving backplane 200.

In some embodiments, with reference to FIGS. 4A and 5A, FIGS. 4A and 5A are structural diagrams of the light-emitting device 100 in a case where the first semiconductor pattern 121 and the second semiconductor pattern 122 are spaced apart. The first semiconductor pattern 121 and the second semiconductor pattern 122 are electrically connected, which may be that the first semiconductor pattern 121 and the second semiconductor pattern 122 are spaced apart, and the third bonding electrode 183 is electrically connected to the first semiconductor pattern 121 through one of two fifth via holes 1703, and is electrically connected to the second semiconductor pattern 122 through the other of the two fifth via holes 1703. In this way, it is conducive to reducing an area of the first semiconductor pattern 121 and the second semiconductor pattern 122, and improving the light exit efficiency of the light-emitting device 100.

Figure 4B:
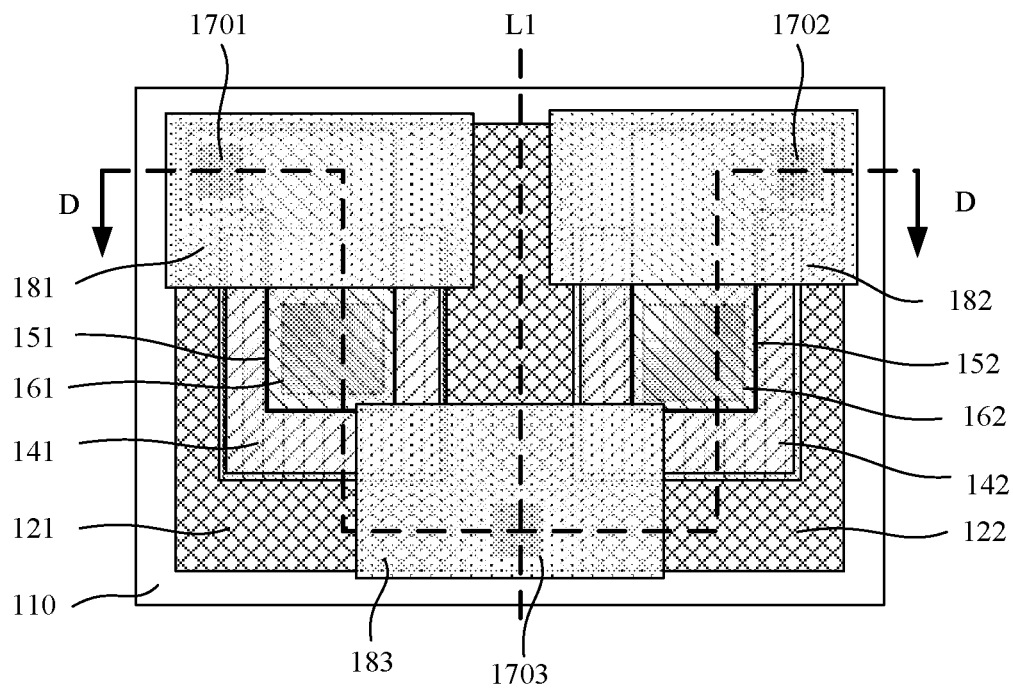
FIG. 4B is another partial enlarged view of a region where a light-emitting device is located in FIG. 1.

In some embodiments, with reference to FIGS. 4B and 5B, FIGS. 4B and 5B are structural diagrams of the light-emitting device 100 in a case where the first semiconductor pattern 121 and the second semiconductor pattern 122 are of a one-piece structure. The first semiconductor pattern 121 and the second semiconductor pattern 122 are electrically connected, which may also be that the first semiconductor pattern 121 and the second semiconductor pattern 122 are of a one-piece structure. That is, there is no gap between the first semiconductor pattern 121 and the second semiconductor pattern 122. The third bonding electrode 183 may be electrically connected to the first semiconductor pattern 121 and the second semiconductor pattern 122 through one or more fifth via holes 1703. In this way, a pattern of the first semiconductor layer 120 is simplified, and one fifth via hole 1703 may be omitted, which is conducive to simplifying the process of manufacturing the light-emitting device 100 and reducing the cost of the manufacturing light-emitting device 100.

It will be noted that, in the embodiments of the present disclosure, only a structure of a portion of the display apparatus 1000 related to solutions of the embodiments of the present disclosure is described. A person skilled in the art knows a structure that is not shown, and thus it is not repeated. For example, the display apparatus 1000 may further include a polarizer, a driving chip and the like.

In some embodiments, the pixel circuit 300 included in the driving backplane 200 includes a first control circuit 310 and a second control circuit 320. The first control circuit 310 is configured to drive one of the first light-emitting portion D1 and the second light-emitting portion D2 of the light-emitting device 100 described in any of the above embodiments, and the second control circuit 320 is configured to drive the other of the first light-emitting portion D1 and the second light-emitting portion D2 of the light-emitting device 100 described in any of the above embodiments. The description will be made below by taking an example in which the first control circuit 310 drives the first light-emitting portion D1 and the second control circuit 320 drives the second light-emitting portion D2.

Figure 6:
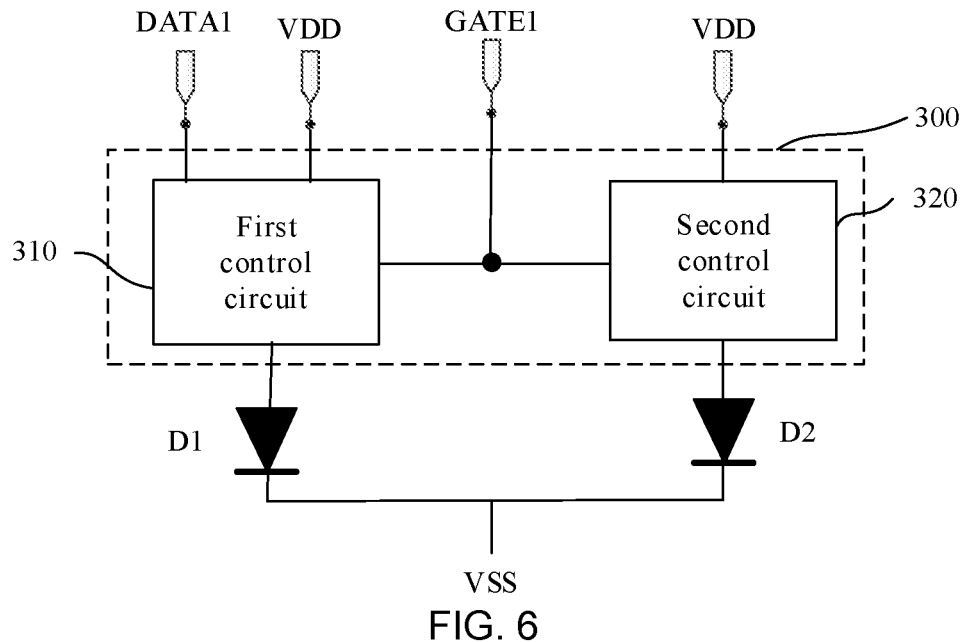
FIG. 6 is a structural block diagram of a pixel circuit, in accordance with some embodiments.

With reference to FIG. 6, the first control circuit 310 is coupled to a first scanning signal terminal GATE1, a first data signal terminal DATA1, a first voltage signal terminal VDD, and the first light-emitting portion D1 of the light-emitting device 100. The first control circuit 310 is configured to, under control of a first scanning signal from the first scanning signal terminal GATE1 and a first data signal from the first data signal terminal DATA1, control connection between the first voltage signal terminal VDD and the first light-emitting portion D1, and control a luminance of the first light-emitting portion D1 to be switched between the first gray scale and the second gray scale.

The first control circuit 310 provided in the embodiments of the present disclosure may control connection and disconnection between the first voltage signal terminal VDD and the first light-emitting portion D1. In a case where the first voltage signal terminal VDD is connected to the first light-emitting portion D1, the first light-emitting portion D1 operates and displays the first gray scale. Since the current flowing through the first light-emitting portion D1 is not adjusted, in a case where the first light-emitting portion D1 operates and the light-emitting device 100 displays different gray scales, the first light-emitting portion D1 displays the same gray scale. In a case where the first voltage signal terminal VDD is disconnected from the first light-emitting portion D1, the first light-emitting portion D1 does not emit light. In this case, the first light-emitting portion D1 displays the second gray scale (gray scale 0).

The second control circuit 320 is coupled to the first scanning signal terminal GATE1, the first voltage signal terminal VDD, and the second light-emitting portion D2 of the light-emitting device 100. The second control circuit 320 is configured to, under control of the first scanning signal from the first scanning signal terminal GATE1, control connection between the first voltage signal terminal VDD and the second light-emitting portion D2, and control a magnitude of the driving current flowing through the second light-emitting portion D2.

The second control circuit 320 provided in the embodiments of the present disclosure may control the connection between the first voltage signal terminal VDD and the second light-emitting portion D2, so that the second light-emitting portion D2 may emit light. Moreover, the second control circuit 320 may control the second light-emitting portion D2 to display different gray scales by controlling the magnitude of the driving current flowing through the second light-emitting portion D2.

The pixel circuit 300 provided in the embodiments of the present disclosure may control the first light-emitting portion D1 and the second light-emitting portion D2 to operate separately. Thus, the pixel circuit 300 may control the first light-emitting portion D1 to operate or not to operate (not to emit light), and control the second light-emitting portion D1 to display the gray scale. Based on this, when the light-emitting device 100 displays the low gray scale, the pixel circuit 300 may control the first light-emitting portion D1 not to operate, and control the second light-emitting portion D2 to operate. That is, the low gray scale is displayed only by the second light-emitting portion D2. In this way, the light-emitting area of the light-emitting device 100 when displaying the low gray scale may be reduced. Compared with the related art, the light-emitting device 100 provided in the embodiments of the present disclosure has a smaller light-emitting area when displaying the same low gray scale. In order to enable the light-emitting device 100 to display the same low gray scale, there is a need to increase the current of the second light-emitting portion D2, so as to increase the current density of the second light-emitting portion D2 and improve the luminous efficiency of the second light-emitting portion D2. The first light-emitting portion D1 displays a fixed gray scale when it operates (emits light). In order to cooperate with the second light-emitting portion D2 to display all gray scales, the fixed gray scale is normally a high gray scale. In this case, the luminous efficiency of the first light-emitting portion D1 itself may be relatively high.

For example, when the light-emitting device 100 needs to display the low gray scale, the first control circuit 310 disconnects the first voltage signal terminal VDD from the first light-emitting portion D1, so that the first light-emitting portion D1 does not emit light. Moreover, the second control circuit 320 connects the first voltage signal terminal VDD to the second light-emitting portion D2, and controls the magnitude of the driving current flowing through the second light-emitting portion D2, so that the second light-emitting portion D2 is controlled to display different low gray scales. As a result, the light-emitting device 100 displays different gray scales.

For example, when the light-emitting device 100 needs to display the high gray scale, the first control circuit 310 controls the connection between the first voltage signal terminal VDD and the first light-emitting portion D1, so that the first light-emitting portion D1 emits light. When the light-emitting device 100 displays different high gray scales, the driving current flowing through the first light-emitting portion D1 is the same. That is, the first light-emitting portion D1 displays the fixed gray scale when it operates (emits light). In this way, the first control circuit 310 only needs to control the connection or disconnection between the first voltage signal terminal VDD and the first light-emitting portion D1, which is conducive to simplifying a structure of the first control circuit 310. Therefore, a structure of the pixel circuit 300 may be simplified, which is conducive to increasing a density of the pixel circuits 300 in the driving backplane 200. The second control circuit 320 controls the connection between the first voltage signal terminal VDD and the second light-emitting portion D2, and controls the magnitude of the driving current flowing through the second light-emitting portion D2, so that the second light-emitting portion D2 is controlled to display the different gray scales. As a result, the light-emitting device 100 displays different gray scales.

The pixel circuit 300 provided in the embodiments of the present disclosure is configured to drive the light-emitting device 100 described in any of the above embodiments. Thus, the light-emitting efficiency of the light-emitting device 100 may be improved, power consumption of the pixel circuit 300 may be reduced when driving the light-emitting device 100 to display the low gray scale, and power consumption of the pixel circuit 300 may be reduced.

It will be understood that both the first light-emitting portion D1 and the second light-emitting portion D2 include an anode voltage terminal and a cathode voltage terminal. The first control circuit 310 is used to electrically connect to the anode voltage terminal of the first light-emitting portion D1, and the second control circuit 320 is used to electrically connect to the anode voltage terminal of the second light-emitting portion D2. In addition, the cathode voltage terminals of the first light-emitting portion D1 and the second light-emitting portion D2 may be electrically connected to a same cathode voltage signal terminal VSS. The cathode voltage signal terminal VSS may provide a negative voltage to the cathode voltage terminal of the first light-emitting portion D1 and the cathode voltage terminal of the second light-emitting portion D2, or the cathode voltage signal terminal VSS may also be directly grounded.

For example, in a case where the light-emitting device 100 includes the bonding electrode layer 18, the first control circuit 310 may be electrically connected to the first bonding electrode 181, the second control circuit 320 may be electrically connected to the second bonding electrode 182, and the cathode voltage signal terminal VSS may be electrically connected to the third bonding electrode 183.

The first control circuit 310 and the second control circuit 320 share same voltage signal terminals (such as the first voltage signal terminal VDD and the first scanning signal terminal GATE1). In this way, wiring arrangement of the driving backplane 200 may be simplified, the difficulty of manufacturing the driving backplane 200 may be reduced, and the cost of manufacturing the light-emitting substrate 1100 may be reduced. Moreover, complexity of the pixel circuit 300 may be reduced, and difficulty of controlling the pixel circuit 300 may be reduced.

Figure 7:
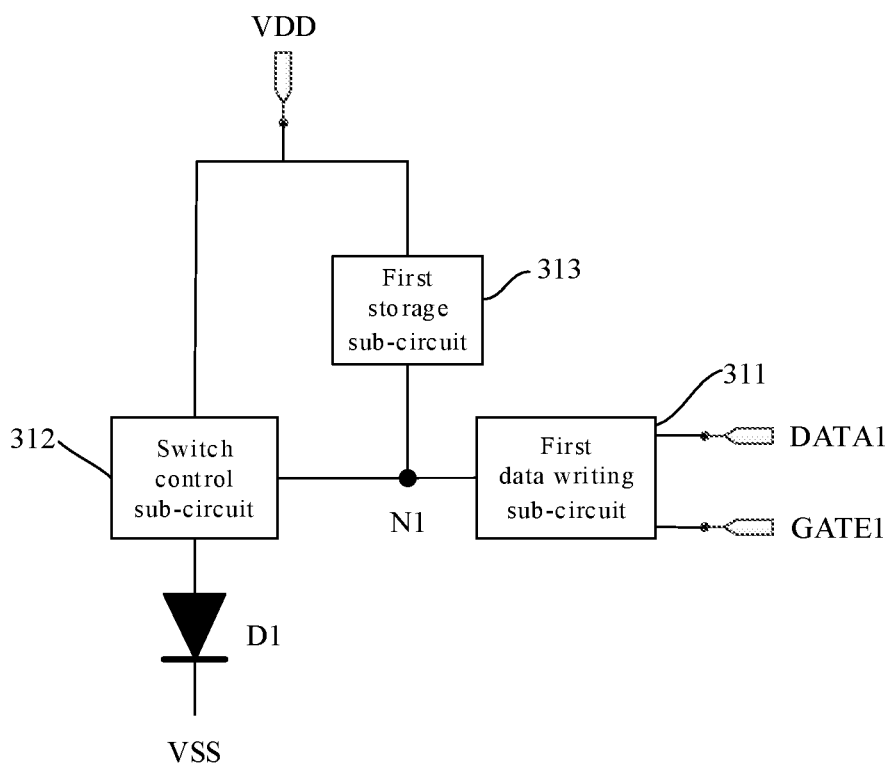
FIG. 7 is a structural block diagram of a first control circuit, in accordance with some embodiments.

In some embodiments, with reference to FIG. 7, the first control circuit 310 includes a first data writing sub-circuit 311, a switch control sub-circuit 312 and a first storage sub-circuit 313.

The first data writing sub-circuit 311 is coupled to the first scanning signal terminal GATE1, the first data signal terminal DATA1 and a first node N1, and is configured to transmit the first data signal from the first data signal terminal DATA1 to the first node N1 under the control of the first scanning signal from the first scanning signal terminal GATE1.

The switch control sub-circuit 312 is coupled to the first node N1, the first voltage signal terminal VDD and the first light-emitting portion D1, and is configured to control the connection between the first voltage signal terminal VDD and the first light-emitting portion D1 under control of a voltage of the first node N1.

The first storage sub-circuit 313 is coupled to the first voltage signal terminal VDD and the first node N1, and is configured to store and maintain the voltage of the first node N1.

Figure 8:
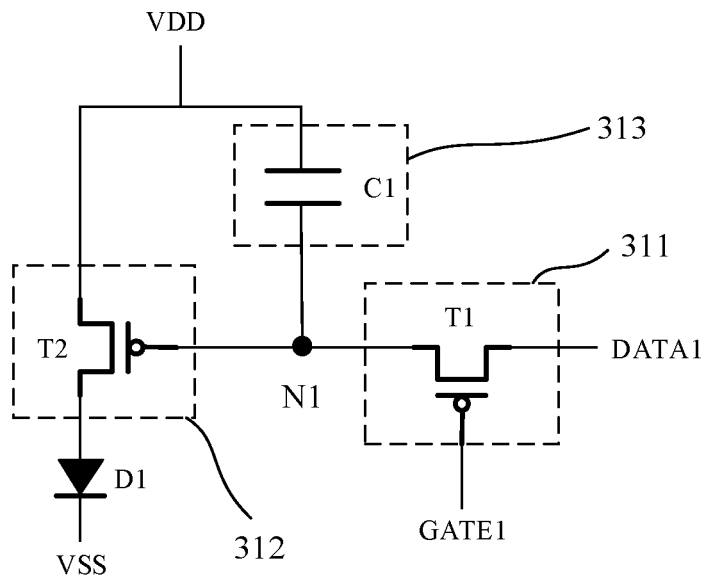
FIG. 8 is a structural diagram of a first control circuit, in accordance with some embodiments.
Figure 12:
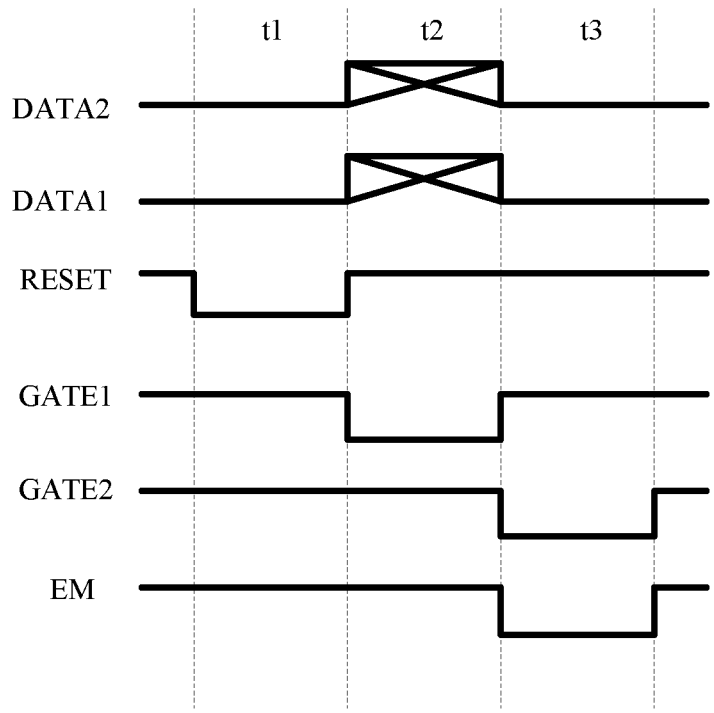
FIG. 12 is a timing control diagram of a pixel circuit, in accordance with some embodiments.

With reference to FIGS. 8 and 12, a frame period of the first light-emitting portion D1 includes a reset phase t1, a scanning phase t2, and a light-emitting phase t3.

In the reset phase t1, the first scanning signal from the first scanning signal terminal GATE1 is at a high level, and a first transistor T1 is turned off.

In the scanning phase t2, the first data signal from the first data signal terminal DATA1 is transmitted to the first node N1 under control of a low level of the first scanning signal. The first data signal may be either a signal for controlling the switch control sub-circuit 312 to be turned on, or a signal for controlling the switch control sub-circuit 312 to be turned off.

In the light-emitting phase t3, the switch control sub-circuit 312 controls the connection or the disconnection between the first voltage signal terminal VDD and the first light-emitting portion D1 under control of the first data signal of the first node N1. The first storage sub-circuit 313 maintains the voltage of the first node N1, so that a light-emitting state of the first light-emitting portion D1 is stable in the frame period.

In some embodiments, when the light-emitting device 100 needs to display the low gray scale, the first data signal may be a signal for controlling the disconnection between the first voltage signal terminal VDD and the first light-emitting portion D1. When the light-emitting device 100 needs to display the high gray scale, the first data signal may be a signal for controlling the connection between the first voltage signal terminal VDD and the first light-emitting portion D1.

In some embodiments, with reference to FIG. 8, the first data writing sub-circuit 311 includes the first transistor T1. A control electrode of the first transistor T1 is coupled to the first scanning signal terminal GATE1, a first electrode of the first transistor T1 is coupled to the first data signal terminal DATA1, and a second electrode of the first transistor T1 is coupled to the first node N1.

The switch control sub-circuit 312 includes a second transistor T2. A control electrode of the second transistor T2 is coupled to the first node N1, a first electrode of the second transistor T2 is coupled to the first voltage signal terminal VDD, and a second electrode of the second transistor T2 is coupled to the first light-emitting portion D1.

The first storage sub-circuit and 313 includes a first storage capacitor C1. A first end of the first storage capacitor C1 is coupled to the first node N1, and a second end of the first storage capacitor C1 is coupled to the first voltage signal terminal VDD.

The first control circuit 310 only includes two transistors and one capacitor, which has a simple structure, and is conducive to reducing a space occupied by the first control circuit 310 and increasing the density of the pixel circuits 300 of the driving backplane 200.

The second control circuit 320 not only needs to control the connection between the first voltage signal terminal VDD and the second light-emitting portion D2, but also needs to control the magnitude of the driving current flowing through the second light-emitting portion D2. Therefore, the magnitude of the current input to the second light-emitting portion D2 needs to be controlled more precisely. A structure of the circuit itself (e.g., transistors and capacitors) will generate a certain energy loss, e.g., a threshold voltage of the driving transistor. Therefore, there is a need to compensate a loss of the circuit itself in the second control circuit 320. The second control circuit 320 may be a circuit adopting an internal compensation technology or a circuit adopting an external compensation technology.

In some embodiments, the second control circuit 320 may be the circuit adopting the internal compensation technology. In this way, with reference to FIG. 9, the second control circuit 320 includes: a second data writing sub-circuit 321, a second storage sub-circuit 322, a first driving sub-circuit 323, a compensation sub-circuit 324, a voltage control sub-circuit 325, a light-emitting control sub-circuit 326 and an initialization sub-circuit 327.

The second data writing sub-circuit 321 is coupled to the first scanning signal terminal GATE1, a second data signal terminal DATA2 and a second node N2, and is configured to transmit a second data signal from the second data signal terminal DATA2 to the second node N2 under the control of the first scanning signal from the first scanning signal terminal GATE1.

The second storage sub-circuit 322 is coupled to the second node N2 and a third node N3, and is configured to store a voltage of the second node N2 and adjust a voltage of the third node N3.

The first driving sub-circuit 323 is coupled to the third node N3, the first voltage signal terminal VDD and a fourth node N4, and is configured to transmit a driving current to the fourth node N4 under control of the voltage of the third node N3 and a first voltage signal from the first voltage signal terminal VDD.

The compensation sub-circuit 324 is coupled to the first scanning signal terminal GATE1, the fourth node N4 and the third node N3, and is configured to compensate a threshold voltage $V_{th}$ of the first driving sub-circuit 323 to the third node N3 under the control of the first scanning signal from the first scanning signal terminal GATE1.

The voltage control sub-circuit 325 is coupled to a second scanning signal terminal GATE2, a second voltage signal terminal VINIT and the second node N2, and is configured to transmit a second voltage signal from the second voltage signal terminal VINIT to the second node N2 under control of a second scanning signal from the second scanning signal terminal GATE2.

The light-emitting control sub-circuit 326 is coupled to an enable signal terminal EM, the fourth node N4 and the second light-emitting portion D2, and is configured to transmit the driving current of the fourth node N4 to the second light-emitting portion D2 under control of an enable signal from the enable signal terminal EM.

The initialization sub-circuit 327 is coupled to a reset signal terminal RESET, the second voltage signal terminal VINIT and the second node N2, and is configured to transmit the second voltage signal from the second voltage signal terminal VINIT to the second node N2 under control of a reset signal from the reset signal terminal RESET.

Figure 9:
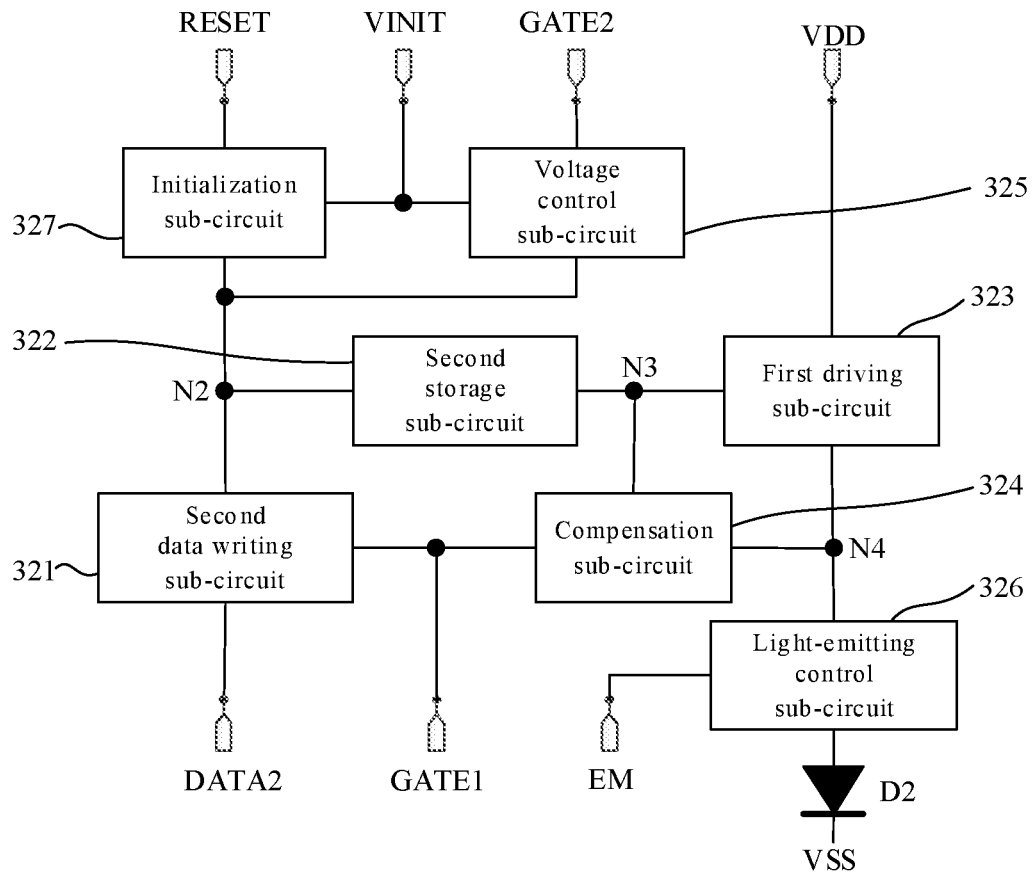
FIG. 9 is a structural block diagram of a second control circuit, in accordance with some embodiments.

With reference to FIGS. 9 and 12, a frame period of the first light-emitting portion D1 and a frame period of second light-emitting portion D2 each include the reset phase t1, the scanning phase t2, and the light-emitting phase t3.

In the reset phase t1, the initialization sub-circuit 327 initializes the voltage of the second node N2.

In the scanning phase t2, the second data writing sub-circuit 321 transmits the second data signal to the second node N2, the second storage sub-circuit 322 stores the voltage of the second node N2, and the compensation sub-circuit 324 compensate the threshold voltage $V_{th}$ of the first driving sub-circuit 323 to the third node N3. The voltage of the second node N2 is $V_{Data2}$, and the voltage $V_{N3}$ of the third node N3 is $V_{DD}+V_{th}$.

In the light-emitting phase t3, the voltage control sub-circuit 325 transmits the second voltage signal to the second node N2, and the voltage of the second node N2 jumps to $V_{GL}$ (i.e., a voltage of the second voltage signal). In this case, under an action of the second storage sub-circuit 322, the voltage of the third node N3 jumps to: $V^{N3}=[V_{DD}+V_{th}-(V_{Data2}-V_{GL})]$. The first driving sub-circuit 323 is in a saturated state. $V_{DD}-V_{N3}=V_{DD}-[V_{DD}+V_{th}-(V_{Data2}-V_{GL})]=V_{data2}-V_{GL}-V_{th}$. The first driving sub-circuit 323 provides the driving current for the second light-emitting portion D2. The driving current of the second light-emitting portion D2 is $I_{D2}$. $I_{D2}=K(V_{N3\text{-}VDD}-V_{th})^2=K(V_{Data2}-V_{GL})^2$, where $V_{DD}$ is the voltage provided by the first voltage signal terminal $V_{DD}$, $V_{N3\text{-}VDD}$ is a voltage difference between the voltage of the third node N3 and the voltage of the first voltage signal terminal $V_{DD}$, and K is a constant related to process design. Thus, it can be seen that the driving current $I_{D2}$ of the second light-emitting portion D2 is irrelevant to the threshold voltage $V_{th}$ of the first driving sub-circuit 323. The second light-emitting portion D2 emits light stably in the light-emitting phase in the frame period.

The second control circuit 320 compensates the threshold voltage $V_{th}$ of the first driving sub-circuit 323 to a gate (third node N3) of the first driving sub-circuit 323 through the compensation sub-circuit 324, so as to eliminate an influence of the threshold voltage $V_{th}$ of the first driving sub-circuit 323 on the driving current.

It will be understood that, the plurality of pixel circuits 300 included in the driving backplane 200 are arranged in rows and columns, each row of pixel circuits 300 is provided with at least one scanning signal line, and the at least one scanning signal line may provide the scanning signal for the row of pixel circuits 300. The rows of pixel circuits 300 are controlled in a row-by-row scanning manner. In some embodiments, reset signal terminals RESET of pixel circuits 300 in any row may be connected to a scanning signal line of a previous row of pixel circuits 300, and second scanning signal terminals GATE2 of pixel circuits 300 in any row may be electrically connected to a scanning signal line of a next row of pixel circuits 300. In this way, an arrangement of scanning signal lines may be simplified, which is beneficial to reduce the difficulty of manufacturing the driving backplane 200 and then reduce the cost of manufacturing the light-emitting substrate 1100.

Figure 10:
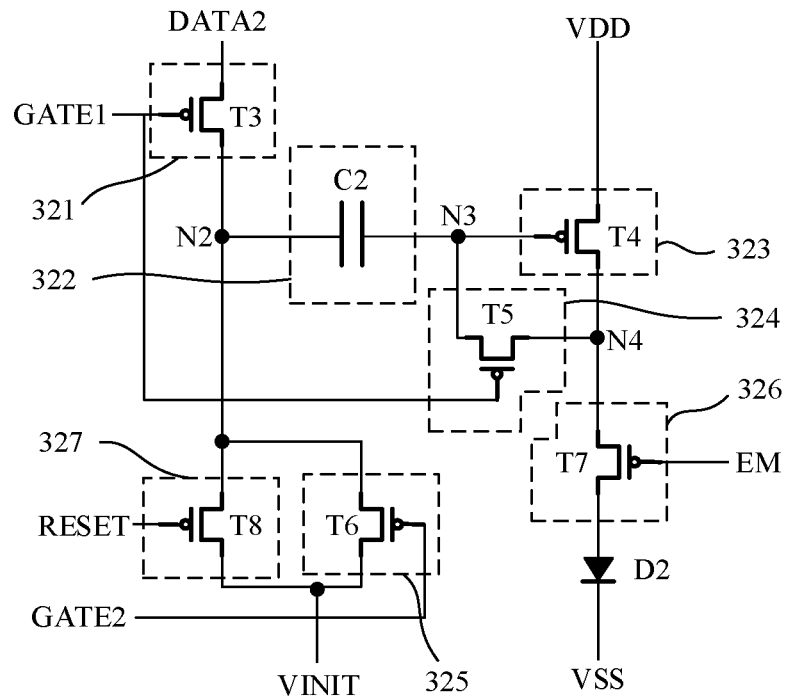
FIG. 10 is a structural diagram of a second control circuit, in accordance with some embodiments.

In some embodiments, with reference to FIG. 10, the second data writing sub-circuit 321 includes a third transistor T3. A control electrode of the third transistor T3 is coupled to the first scanning signal terminal GATE1, a first electrode of the third transistor T3 is coupled to the second data signal terminal DATA2, and a second electrode of the third transistor T3 is coupled to the second node N2.

The second storage sub-circuit 322 includes a second storage capacitor C2. A first end of the second storage capacitor C2 is electrically connected to the second node N2, and a second end of the second storage capacitor C2 is electrically connected to the third node N3.

The first driving sub-circuit 323 includes a fourth transistor T4. A control electrode of the fourth transistor T4 is coupled to the second node N3, a first electrode of the fourth transistor T4 is coupled to the first voltage signal terminal $V_{DD}$, and a second electrode of the fourth transistor T4 is coupled to the fourth node N4.

The compensation sub-circuit 324 includes a fifth transistor T5. A control electrode of the fifth transistor T5 is coupled to the first scanning signal terminal GATE1, a first electrode of the fifth transistor T5 is coupled to the fourth node N4, and a second electrode of the fifth transistor T5 is coupled to the third node N3.

The voltage control sub-circuit 325 includes a sixth transistor T6. A control electrode of the sixth transistor T6 is coupled to the second scanning signal terminal GATE2, a first electrode of the sixth transistor T6 is coupled to the second voltage signal terminal VINIT, and a second electrode of the sixth transistor T6 is coupled to the second node N2.

The light-emitting control sub-circuit 326 includes a seventh transistor T7. A control electrode of the seventh transistor T7 is coupled to the enable signal terminal EM, a first electrode of the seventh transistor T7 is coupled to the fourth node N4, and a second electrode of the seventh transistor T7 is coupled to the second light-emitting portion D2.

The initialization sub-circuit 327 includes an eighth transistor T8. A control electrode of the eighth transistor T8 is coupled to the reset signal terminal RESET, a first electrode of the eighth transistor T8 is coupled to the second voltage signal terminal VINIT, and a second electrode of the eighth transistor T8 is coupled to the second node N2.

Figure 11:
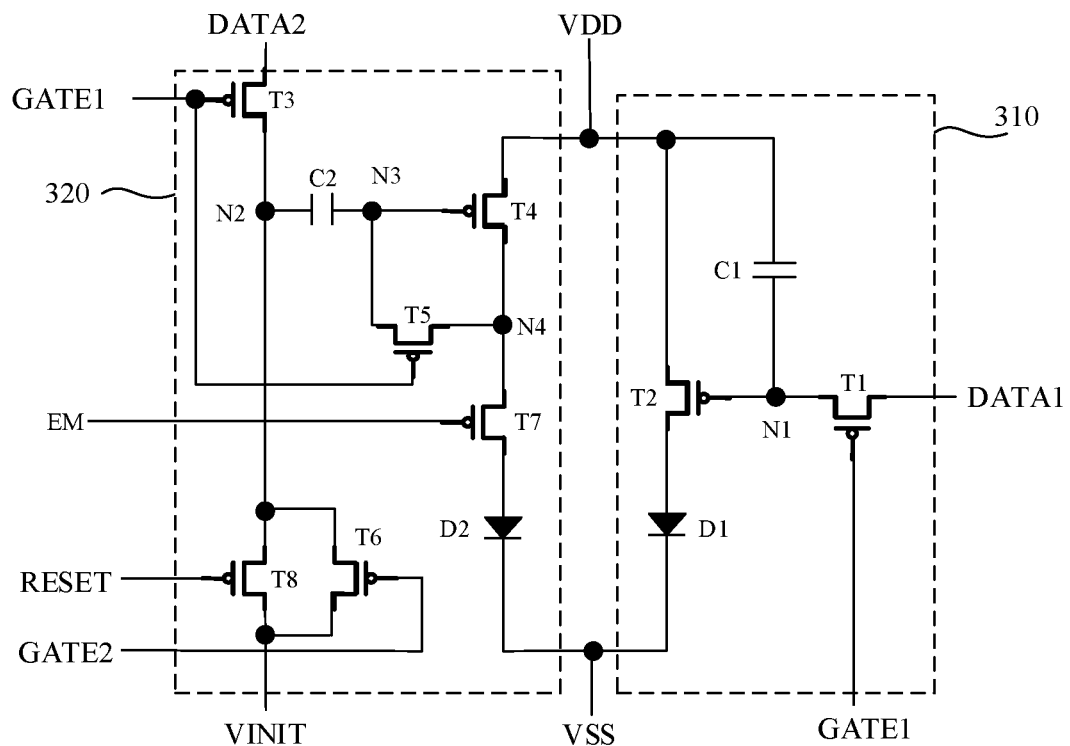
FIG. 11 is a structural diagram of a pixel circuit, in accordance with some embodiments.

For example, with reference to FIGS. 11 and 12, in the reset phase t1, the reset signal terminal RESET provides a low level signal, and the first scanning signal terminal GATE1, the second scanning signal terminal GATE2 and the enable signal terminal EM provide high level signals. The eighth transistor T8 is turned on and other transistors are turned off, so to initialize a voltage of the second storage capacitor C2.

In the scanning phase t2, the first scanning signal terminal GATE1 provides a low level signal, and the reset signal terminal RESET, the second scanning signal terminal GATE2 and the enable signal terminal EM provide high level signals. The first transistor T1, the third transistor T3 and the fifth transistor T5 are turned on, and other transistors are turned off. The first data signal is written into first node N1, the second data signal is written to the second node N2, and the threshold voltage $V_{th}$ of the fourth transistor T4 is compensated to the third node N3.

In the light-emitting phase t3, the second scanning signal terminal GATE2 and the enable signal terminal EM provide low level signals, and the reset signal terminal RESET and the first scanning signal terminal GATE1 provide high level signals. In the second control circuit 320, the sixth transistor T6, the fourth transistor T4 and the seventh transistor T7 are turned on, and other transistors are turned off. The voltage of the second node N2 jumps to $V_{GL}$, and the voltage of the third node N3 jumps to $V_{DD}+V_{th}-(V_{Data2}-V_{GL})$. The fourth transistor T4 drives the second light-emitting portion D2 to operate under control of the voltage of the third node N3. In the first control circuit 310, if the first data signal is a low level signal, the second transistor T2 is turned on, so that the first light-emitting portion D1 displays the first gray scale. Thus, the light-emitting device 100 displays the high gray scale. If the first data signal is a high level signal, the second transistor T2 is turned off, so that the first light-emitting portion D1 displays the second gray scale (gray scale 0). Thus, the light-emitting device 100 displays the low gray scale.

In some embodiments, the second control circuit 320 may be the circuit adopting the external compensation technology. In this way, with reference to FIG. 13, the second control circuit 320 includes: a feedback sub-circuit 328, an input sub-circuit 329, a second driving sub-circuit 3210, a third storage sub-circuit 3211 and a modulation sub-circuit 3212.

The feedback sub-circuit 328 is coupled to the first scanning signal terminal GATE1, a feedback signal terminal M1 and a feedback node N0, and is configured to transmit a voltage of the feedback node N0 to the feedback signal terminal M1 under the control of the first scanning signal from the first scanning signal terminal GATE1.

The feedback node N0 is coupled to the second light-emitting portion D2. That is, the voltage input to the second light-emitting portion D2 is controlled by the voltage of the feedback node N0. Therefore, by adjusting the voltage of the feedback node N0, the driving current of the second light-emitting portion D2 may be controlled, so as to control the gray scale displayed by the second light-emitting portion D2.

The input sub-circuit 329 is coupled to the first scanning signal terminal GATE1, an input signal terminal M2 and a fifth node N5, and is configured to transmit an input signal from the input signal terminal M2 to the fifth node N5 under the control of the first scanning signal from the first scanning signal terminal GATE1.

The input signal is generated according to the voltage of the feedback node N0 and a third data signal for controlling the gray scale of the second light-emitting portion D2. The third data signal is used to control the gray scale displayed by the second light-emitting portion D2. That is, the voltage of the feedback node N0 needs to be adjusted to be equal to a voltage of the third data signal, so that the second light-emitting portion D2 may display a corresponding gray scale according to the third data signal. Based on this, according to the voltage of the feedback node N0 and the voltage of the third data signal, the input signal may be input to the fifth node N5 through the input sub-circuit 329.

The second driving sub-circuit 3210 is coupled to the fifth node N5, a sixth node N6 and the feedback node N0, and is configured to adjust the voltage of the feedback node N0 according to a voltage of the sixth node N6 under control of a voltage of the fifth node N5.

Under control of the input signal input by the input sub-circuit 329 to the fifth node N5, impedance of the second driving sub-circuit 3210 may be adjusted so as to adjust the voltage shared (consumed) by the second driving sub-circuit 3210, and then the voltage of the feedback node N0 is adjusted until the voltage of the feedback node N0 is equal to the voltage of the third data signal.

The third storage sub-circuit 3211 is coupled to the first voltage signal terminal VDD and the fifth node N5, and is configured to store and maintain the voltage of the fifth node N5.

The third storage sub-circuit 3211 is used to maintain the voltage of the fifth node N5 during the light-emitting phase in a frame, so that the voltage of the feedback node N0 is kept stable, and the second light-emitting portion D2 emits light stably.

The modulation sub-circuit 3212 is coupled to a third scanning signal terminal GATE3, the first voltage signal terminal VDD and the sixth node N6. The modulation sub-circuit 3212 is configured to, under control of a third scanning signal from the third scanning signal terminal GATE3, transmit the first voltage signal from the first voltage signal terminal VDD to the sixth node N6, and modulate time of the connection between the first voltage signal terminal VDD and the second light-emitting portion D2.

In a case where the second light-emitting portion D2 displays the low gray scale, if the second light-emitting portion D2 continues to emit light during the light-emitting phase in a frame, the current required by the second light-emitting portion D2 is small, and the voltage required by the feedback node N0 is small. As a result, the voltage shared by the second driving sub-circuit 3210 is high, and an energy loss of the second control circuit 320 itself is high. The modulation sub-circuit 3212 controls the connection between the first voltage signal terminal VDD and the sixth node N6, and controls light-emitting duration of the second light-emitting portion D2 by controlling the connection time. Therefore, the modulation sub-circuit 3212 may increase the current required by the second light-emitting portion D2 by reducing the light-emitting duration of the second light-emitting portion D2, and thus increase the voltage required by feedback node N0. In this way, the energy loss of the second control circuit 320 itself may be reduced, and the power consumption of the light-emitting substrate 1100 may be reduced.

Figure 15:
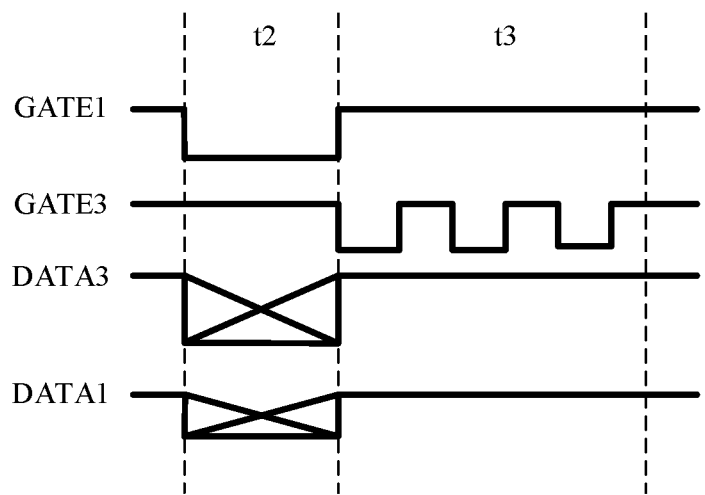
FIG. 15 is another timing control diagram of a pixel circuit, in accordance with some embodiments.

For example, with reference to FIG. 15, in a case where the second light-emitting portion D2 needs to display the low gray scale, in the light-emitting phase t3, the third scanning signal of the third scanning signal terminal GATE3 may be a signal with alternating high and low levels. In this way, the light-emitting duration of the second light-emitting portion D2 may be reduced, so as to increase the current of the second light-emitting portion D2 when emitting light, increase the current density of the second light-emitting portion D2 and thus increase the light-emitting efficiency of the second light-emitting portion D2.

For example, in a case where the second light-emitting portion D2 needs to display the high gray scale, in the light-emitting phase t3, the third scanning signal from the third scanning signal terminal GATE3 may continuously be at a high level. In this way, by increasing the light-emitting duration of the second light-emitting portion D2, the current of the second light-emitting portion D2 when emitting light may be reduced. As a result, an excessive current of the second light-emitting portion D2 may be avoided, and a load of the second control circuit 320 may be reduced.

Figure 13:
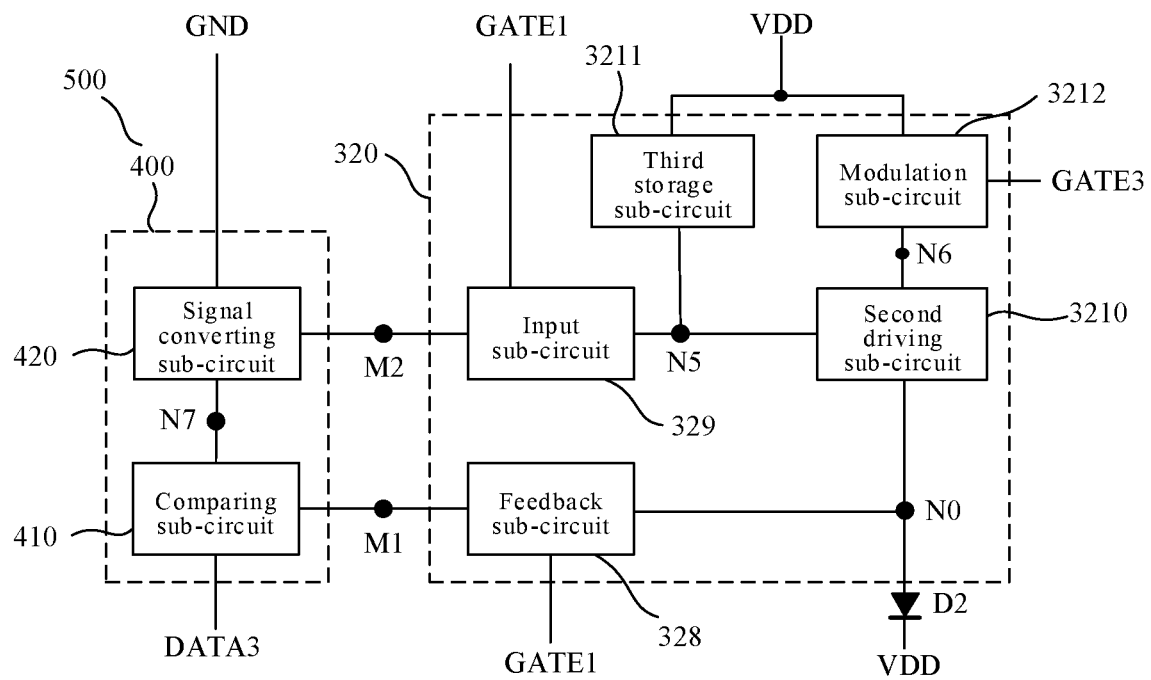
FIG. 13 is a structural block diagram of a second control circuit and a third control circuit, in accordance with some embodiments.

In some embodiments, in the case where the second control circuit 320 is the circuit adopting the external compensation technology, the second control circuit 320 of the pixel circuit 300 includes the feedback sub-circuit 328, the input sub-circuit 329, the second driving sub-circuit 3210, the third storage sub-circuit 3211, and the modulation sub-circuit 3212. With reference to FIG. 13, the light-emitting substrate 1100 at least further includes a circuit board 500. The circuit board is electrically connected to the driving backplane 200. The circuit board includes a third control circuit 400.

The third control circuit 400 is configured to output the input signal for adjusting the voltage of the fifth node N5 to the fifth node N5 according to the voltage of the feedback node N0 received by the feedback signal terminal M1 and the third data signal.

In some embodiments, with reference to FIG. 13, the third control circuit 400 includes a comparing sub-circuit 410 and a signal converting sub-circuit 420.

The comparing sub-circuit 410 is coupled to the third data signal terminal DATA3, the feedback signal terminal M1, and a seventh node N7. The comparing sub-circuit 410 is configured to compare the voltage of the feedback node N0 transmitted by the feedback signal terminal M1 with the voltage of the third data signal from the third data signal terminal DATA3, and output an adjustment voltage to the seventh node N7 according to the comparison result. The third data signal terminal DATA3 is configured to transmit the third data signal for controlling the gray scale of the second light-emitting portion D2.

The signal converting sub-circuit 420 is coupled to the seventh node N7, a ground voltage terminal GND and the input signal terminal M2, and is configured to transmit the input signal for adjusting the voltage of the fifth node N5 to the input signal terminal M2 according to the adjustment voltage of the seventh node N7 and a voltage of the ground voltage terminal GND.

In the second control circuit 320 adopting the external compensation technology provided in the embodiments of the present disclosure, in the scanning phase t2, the voltage of the feedback node N0 is transmitted to the feedback signal terminal M1 under control of the feedback sub-circuit 328; the comparing sub-circuit 410 receives the voltage $V_{N0}$ of the feedback node N0 received by the feedback signal terminal M1 and compares the voltage $V_{N0}$ of the feedback node N0 with the voltage $V_{Data3}$ of the third data signal from the third data signal terminal DATA3, and then outputs the adjustment voltage to the seventh node N7 according to the comparison result; and the signal converting sub-circuit 420 outputs an input signal to the input signal terminal M2 according to the adjustment voltage received from the seventh node N7. Then, the input signal is output to the fifth node N5 under control of the input sub-circuit 329, and the voltage shared by the second driving sub-circuit 3210 is controlled by the voltage of the fifth node N5, thereby adjusting the voltage of the feedback node N0. The sum of the voltage shared by the second driving sub-circuit 3210 and the voltage of the feedback node N0 is equal to the voltage provided by the first voltage signal terminal VDD.

The third control circuit 400 may directly adjust an anode voltage of the second light-emitting portion D2 (because the feedback node N0 is directly electrically connected to the anode voltage terminal of the second light-emitting portion D2), so that the anode voltage of the second light-emitting portion D2 is equal to the voltage of the third data signal of the third data signal terminal DATA3. Therefore, there is no need to compensate the threshold voltage of the second driving sub-circuit 3210, and the second driving sub-circuit 3210 may operate in a linear region.

Figure 14:
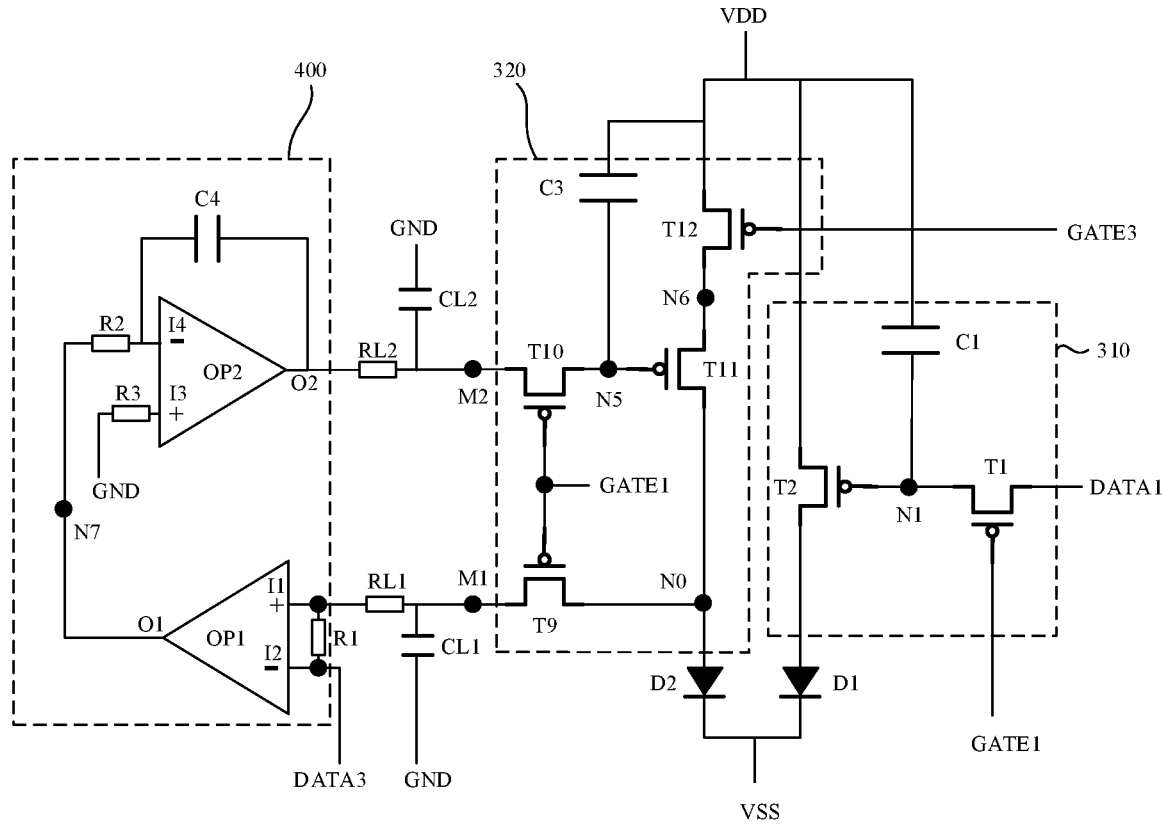
FIG. 14 is a structural diagram of another pixel circuit, in accordance with some embodiments.

In some embodiments, with reference to FIGS. 13 and 14, the feedback sub-circuit 328 includes a ninth transistor T9. A control electrode of the ninth transistor M9 is coupled to the first scanning signal terminal GATE1, a first electrode of the ninth transistor M9 is coupled to the feedback node N0, and a second electrode of the ninth transistor M9 is coupled to the feedback signal terminal M1.

The input sub-circuit 329 includes a tenth transistor T10. A control electrode of the tenth transistor T10 is coupled to the first scanning signal terminal GATE1, a first electrode of the tenth transistor T10 is coupled to the input signal terminal M2, and a second electrode of the tenth transistor T10 is coupled to the fifth node N5.

The second driving sub-circuit 3210 includes an eleventh transistor T11. A control electrode of the eleventh transistor T11 is coupled to the fifth node N5, a first electrode of the eleventh transistor T11 is coupled to the sixth node N6, and a second electrode of the eleventh transistor T11 is coupled to the feedback node N0.

The third storage sub-circuit 3211 includes a third capacitor C3. A first end of the third capacitor C3 is coupled to the first voltage signal terminal VDD, and a second end of the third capacitor C3 is coupled to the fifth node N5.

The modulation sub-circuit 3212 includes a twelfth transistor T12. A control electrode of the twelfth transistor T12 is coupled to the third scanning signal terminal GATE3, and a first electrode of the twelfth transistor T12 is coupled to the first voltage signal terminal VDD, and a second electrode of the twelfth transistor T12 is coupled to the sixth node N6.

In some embodiments, with reference to FIGS. 13 and 14, the comparing sub-circuit 410 includes a first amplifier OP1. The first amplifier OP1 includes a first positive input terminal I1, a first negative input terminal I2 and a first output terminal O1. The first positive input terminal I1 is coupled to the feedback signal terminal M1. The first negative input terminal I2 is coupled to the third data signal terminal DATA3. The first output terminal O1 is coupled to the seventh node N7.

The signal converting sub-circuit 420 includes a second amplifier OP2 and a fourth capacitor C4. The second amplifier OP2 has a second positive input terminal I3, a second negative input terminal I4 and a second output terminal O2. The second positive input terminal I3 is coupled to the ground voltage terminal GND, and the second negative input terminal I4 is coupled to the seventh node N7, and the second output terminal O2 is coupled to the signal input terminal M2. A first end of the fourth capacitor C4 is coupled to the second negative input terminal I4, and a second end of the fourth capacitor C4 is coupled to the second output terminal O2.

For example, with reference to FIGS. 14 and 15, a frame period includes a scanning phase t2 and a light-emitting phase t3.

The scanning period t2 is described as follows.

The first data signal terminal DATA1 outputs the first data signal, the first scanning signal is a low level signal, the first transistor T1 is turned on, and the first data signal from the first data signal terminal DATA1 is transmitted to the first node N1. The first data signal may be the low level signal (for displaying the high gray scale) or the high level signal (for displaying the low gray scale).

The ninth transistor T9 and the tenth transistor T10 are turned on. The voltage of the feedback node N0 is transmitted to the first positive input terminal I1 of the first amplifier OP1, and the third data signal from the third data signal terminal DATA3 is transmitted to the first negative input terminal I2 of the first amplifier OP1. The first amplifier OP1 transmits the adjustment voltage to the seventh node N7 according to the voltage of the feedback node N0 and the voltage of the third data signal. The fourth capacitor C4 is charged or discharged according to the adjustment voltage received from the seventh node N7, so as to change a voltage of the second output terminal O2 of the second amplifier OP2 (i.e., change the voltage of the fifth node N5), and in turn, control a voltage of a gate of the eleventh transistor T11. Therefore, impedance of the eleventh transistor T11 is controlled, and a voltage shared by the eleventh transistor T11 is adjusted. As a result, a purpose of adjusting the voltage of the feedback node N0 may be achieved, and the voltage of the feedback node N0 is adjusted to be equal to the voltage of the third data signal.

For example, in a case where the voltage $V_{N0}$ of the feedback node N0 (the anode voltage of the second light-emitting portion D2) is less than the voltage $V_{Data3}$ of the third data signal of the third data signal terminal DATA3, the first output terminal O1 of the first amplifier OP1 outputs a low level adjustment voltage (negative voltage signal). A potential of an end of the fourth capacitor C4 decreases, the fourth capacitor C4 begins to discharge, and the second output terminal O2 outputs a low level voltage signal. The voltage of the fifth node N5 decreases, the impedance of the eleventh transistor T11 decreases, the voltage shared by the eleventh transistor T11 decreases, and the voltage of the feedback node N0 increases until the voltage $V_{N0}$ of the feedback node N0 is equal to the voltage $V_{Data3}$ of the third data signal.

The light-emitting period t3 is described as follows.

The first light-emitting portion D1 operates (emits light) or does not operate (does not emit light) according to the first data signal. For example, in a case where the first data signal is a low level signal, the first light-emitting portion D1 operates. In a case where the first data signal is a high level signal, the first light-emitting portion D1 does not operate.

The third scanning signal terminal GATE3 provides a signal with discontinuous low levels or a continuous low level. The second light-emitting portion D2 emits light when the signal provided by the third scanning signal terminal GATE3 is at the low level, and does not emit light when the signal provided by the third scanning signal terminal GATE3 is at a high level.

In some embodiments, feedback signal terminals M1 of pixel circuits 300 in a same column are coupled to the first positive input terminal I1 of the first amplifier OP1 of the same third control circuit 400. Input signal terminals M2 of the pixel circuits 300 in the same column are coupled to the second output terminal O2 of the second amplifier OP2 of the same third control circuit 400. That is, the pixel circuits 300 in the same column are coupled to the same third control circuit 400.

In some embodiments, with reference to FIG. 14, the comparing sub-circuit 410 further includes a first resistor R1. A first end of the first resistor R1 is electrically connected to the first positive input terminal I1, and a second end of the first resistor R1 is electrically connected to the first negative input terminal I2. During the light-emitting substrate 1100 operates, there is a blank period in the third data signal between two adjacent frame periods. In this period, the first negative input terminal I2 of the first amplifier OP1 is in a floating state. The resistor R1 may reduce or even eliminate the noise. For example, a resistance value of the first resistor R1 is generally set to be relatively high, such as 1 KΩ, 2 KΩ, or the like.

It will be understood that, in some other embodiments, the first resistor R1 may not be provided.

The signal converting sub-circuit 420 further includes a second resistor R2 and a third resistor R3. A first end of the second resistor R2 is electrically connected to the seventh node N7, and a second end of the second resistor R2 is electrically connected to the second negative input terminal I4. A first end of the third resistor R3 is electrically connected to the ground voltage terminal GND, and a second end of the third resistor R3 is electrically connected to the second positive input terminal I3.

In some embodiments, with reference to FIG. 14, a line itself between the feedback signal terminal M1 and the first positive input terminal I1 has a resistance RL1, and the line may form a capacitance CL1 with other line in the light-emitting substrate 1100. Similarly, a line itself between the input signal terminal M2 and the second output terminal O2 has a resistance RL2, and the line may form a capacitance CL2 with other line in the light-emitting substrate 1100. That is, in the drawing, RL1, CL1, RL2 and CL2 are capacitors or resistors generated by the lines themselves. In some other schematic diagrams, RL1, CL1, RL2 and CL2 may not be shown. For example, the product of RL1 and CL1 is equal to the product of RL2 and CL2, so that charging and discharging rates of the fourth capacitor C4 are equal to a rate at which the first amplifier OP1 acquires the voltage of the feedback node N0. As a result, the fourth capacitor C4 is charged and discharged stably.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:
   a first semiconductor layer including a first semiconductor pattern and a second semiconductor pattern;
   a light-emitting functional layer disposed on one of two opposite sides of the first semiconductor layer in a thickness direction of the first semiconductor layer, the light-emitting functional layer including a first light-emitting pattern and a second light-emitting pattern spaced apart;
   a second semiconductor layer disposed on a side of the light-emitting functional layer away from the first semiconductor layer, the second semiconductor layer including a third semiconductor pattern and a fourth semiconductor pattern spaced apart;
   an electrode layer disposed on a side of the second semiconductor layer away from the first semiconductor layer, the electrode layer including a first electrode and a second electrode spaced apart, wherein the first electrode is electrically connected to the third semiconductor pattern, and the second electrode is electrically connected the fourth semiconductor pattern; and
   a passivation layer disposed between the second semiconductor layer and the electrode layer, wherein the passivation layer is provided with a first via hole and a second via hole therein, the first electrode is electrically connected to the third semiconductor pattern through the first via hole, and the second electrode is electrically connected to the fourth semiconductor pattern through the second via hole;
   wherein, orthographic projections of the first semiconductor pattern, the first light-emitting pattern and the third semiconductor pattern on a reference plane at least partially overlap to form a first light-emitting portion; orthographic projections of the second semiconductor pattern, the second light-emitting pattern and the fourth semiconductor pattern on the reference plane at least partially overlap to form a second light-emitting portion; and the reference plane is parallel to a plane where the first semiconductor layer is located.

2. A pixel circuit configured to drive the light-emitting device according to claim 1, comprising:
   a first control circuit coupled to a first scanning signal terminal, a first data signal terminal, a first voltage signal terminal and the first light-emitting portion of the light-emitting device, wherein the first control circuit is configured to, under control of a first scanning signal from the first scanning signal terminal and a first data signal from the first data signal terminal, control connection between the first voltage signal terminal and the first light-emitting portion, and control a luminance of the first light-emitting portion to be switched between a first gray scale and a second gray scale; and
   a second control circuit coupled to the first scanning signal terminal, the first voltage signal terminal and the second light-emitting portion of the light-emitting device, wherein the second control circuit is configured to, under control of the first scanning signal from the first scanning signal terminal, control connection between the first voltage signal terminal and the second light-emitting portion, and control a magnitude of a driving current flowing through the second light-emitting portion, wherein the second control circuit includes:
      a second data writing sub-circuit, the second data writing sub-circuit being coupled to the first scanning signal terminal, a second data signal terminal and a second node, and being configured to transmit a second data signal from the second data signal terminal to the second node under the control of the first scanning signal from the first scanning signal terminal;
      a second storage sub-circuit, the second storage sub-circuit being coupled to the second node and a third node, and being configured to store a voltage of the second node and adjust a voltage of the third node;
      a first driving sub-circuit, the first driving sub-circuit being coupled to the third node, the first voltage signal terminal and a fourth node, and being configured to transmit a driving current to the fourth node under control of the voltage of the third node and a first voltage signal from the first voltage signal terminal;
      a compensation sub-circuit, the compensation sub-circuit being coupled to the first scanning signal terminal, the fourth node and the third node, and being configured to compensate a threshold voltage of the first driving sub-circuit to the third node under the control of the first scanning signal from the first scanning signal terminal;
      a voltage control sub-circuit, the voltage control sub-circuit being coupled to a second scanning signal terminal, a second voltage signal terminal and the second node, and being configured to transmit a second voltage signal from the second voltage signal terminal to the second node under control of a second scanning signal from the second scanning signal terminal;
      a light-emitting control sub-circuit, the light-emitting control sub-circuit being coupled to an enable signal terminal, the fourth node and the second light-emitting portion, and being configured to transmit the driving current of the fourth node to the second light-emitting portion under control of an enable signal from the enable signal terminal; and an initialization sub-circuit, the initialization sub-circuit being coupled to a reset signal terminal, the second voltage signal terminal and the second node, and being configured to transmit the second voltage signal from the second voltage signal terminal to the second node under control of a reset signal from the reset signal terminal.

3. The pixel circuit according to claim 2, wherein the first control circuit includes:

a first data writing sub-circuit, the first data writing sub-circuit being coupled to the first scanning signal terminal, the first data signal terminal and a first node, and being configured to transmit the first data signal from the first data signal terminal to the first node under the control of the first scanning signal from the first scanning signal terminal;

a switch control sub-circuit, the switch control sub-circuit being coupled to the first node, the first voltage signal terminal and the first light-emitting portion, and being configured to control the connection between the first voltage signal terminal and the first light-emitting portion under control of a voltage of the first node; and a first storage sub-circuit, the first storage sub-circuit being coupled to the first voltage signal terminal and the first node, and being configured to store and maintain the voltage of the first node.

4. The pixel circuit according to claim 3, wherein the first data writing sub-circuit includes:

a first transistor, a control electrode of the first transistor being coupled to the first scanning signal terminal, a first electrode of the first transistor being coupled to the first data signal terminal, and a second electrode of the first transistor being coupled to the first node;

the switch control sub-circuit includes:

a second transistor, a control electrode of the second transistor being coupled to the first node, a first electrode of the second transistor being coupled to the first voltage signal terminal, and a second electrode of the second transistor being coupled to the first light-emitting portion; and the first storage sub-circuit includes:

a first storage capacitor, a first end of the first storage capacitor being coupled to the first node, and a second end of the first storage capacitor being coupled to the first voltage signal terminal.

5. The pixel circuit according to claim 2, wherein the second data writing sub-circuit includes:

a third transistor, a control electrode of the third transistor being coupled to the first scanning signal terminal, a first electrode of the third transistor being coupled to the second data signal terminal, and a second electrode of the third transistor being coupled to the second node;

the second storage sub-circuit includes:

a second storage capacitor, a first end of the second storage capacitor being electrically connected to the second node, and a second end of the second storage capacitor being electrically connected to the third node;

the first driving sub-circuit includes:

a fourth transistor, a control electrode of the fourth transistor being coupled to the third node, a first electrode of the fourth transistor being coupled to the first voltage signal terminal, and a second electrode of the fourth transistor being coupled to the fourth node;

the compensation sub-circuit includes:

a fifth transistor, a control electrode of the fifth transistor being coupled to the first scanning signal terminal, a first electrode of the fifth transistor being coupled to the fourth node, and a second electrode of the fifth transistor being coupled to the third node;

the voltage control sub-circuit includes:

a sixth transistor, a control electrode of the sixth transistor being coupled to the second scanning signal terminal, a first electrode of the sixth transistor being coupled to the second voltage signal terminal, and a second electrode of the sixth transistor being coupled to the second node;

the light-emitting control sub-circuit includes:

a seventh transistor, a control electrode of the seventh transistor being coupled to the enable signal terminal, a first electrode of the seventh transistor being coupled to the fourth node, and a second electrode of the seventh transistor being coupled to the second light-emitting portion; and the reset sub-circuit includes:

an eighth transistor, a control electrode of the eighth transistor being coupled to the reset signal terminal, a first electrode of the eighth transistor being coupled to the second voltage signal terminal, and a second electrode of the eighth transistor being coupled to the second node.

6. The light-emitting device according to claim 1, further comprising:

at least one insulating layer disposed on a side of the electrode layer away from the first semiconductor layer, the at least one insulating layer being provided with a third via hole and a fourth via hole therein; and a bonding electrode layer disposed on a side of the at least insulating layer away from the electrode layer, wherein the bonding electrode layer includes a first bonding electrode and a second bonding electrode, the first bonding electrode is electrically connected to the first electrode through the third via hole, and the second bonding electrode is electrically connected to the second electrode through the fourth via hole.

7. The light-emitting device according to claim 6, wherein the at least one insulating layer is further provided with at least one fifth via hole therein; and the bonding electrode layer further includes a third bonding electrode, and the third bonding electrode is electrically connected to the first semiconductor pattern and the second semiconductor pattern through the at least one fifth via hole.

8. The light-emitting device according to claim 6, wherein the at least one insulating layer includes at least one of a reflective layer, a heat dissipation layer and an encapsulation layer.

9. A pixel circuit configured to drive the light-emitting device according to claim 1, comprising:

a first control circuit coupled to a first scanning signal terminal, a first data signal terminal, a first voltage signal terminal and the first light-emitting portion of the light-emitting device, wherein the first control circuit is configured to, under control of a first scanning signal from the first scanning signal terminal and a first data signal from the first data signal terminal, control connection between the first voltage signal terminal and the first light-emitting portion, and control a luminance of the first light-emitting portion to be switched between a first gray scale and a second gray scale; and
a second control circuit coupled to the first scanning signal terminal, the first voltage signal terminal and the second light-emitting portion of the light-emitting device, wherein the second control circuit is configured to, under control of the first scanning signal from the first scanning signal terminal, control connection between the first voltage signal terminal and the second light-emitting portion, and control a magnitude of a driving current flowing through the second light-emitting portion, wherein the second control circuit includes:
  a feedback sub-circuit, the feedback sub-circuit being coupled to the first scanning signal terminal, a feedback signal terminal and a feedback node, and being configured to transmit a voltage of the feedback node to the feedback signal terminal under the control of the first scanning signal from the first scanning signal terminal; and the feedback node being coupled to the second light-emitting portion;
  an input sub-circuit, the input sub-circuit being coupled to the first scanning signal terminal, an input signal terminal and a fifth node, and being configured to transmit an input signal from the input signal terminal to the fifth node under the control of the first scanning signal from the first scanning signal terminal; and the input signal being generated according to the voltage of the feedback node and a third data signal for controlling a gray scale of the second light-emitting portion;
  a second driving sub-circuit, the second driving sub-circuit being coupled to the fifth node, a sixth node and the feedback node, and being configured to adjust the voltage of the feedback node according to a voltage of the sixth node under control of a voltage of the fifth node;
  a third storage sub-circuit, the third storage sub-circuit being coupled to the first voltage signal terminal and the fifth node, and being configured to store and maintain the voltage of the fifth node; and
  a modulation sub-circuit, the modulation sub-circuit being coupled to a third scanning signal terminal, the first voltage signal terminal and the sixth node, and being configured to, under control of a third scanning signal from the third scanning signal terminal, transmit the first voltage signal from the first voltage signal terminal to the sixth node, and modulate time of the connection between the first voltage signal terminal and the second light-emitting portion.

10. The pixel circuit according to claim 9, wherein
the feedback sub-circuit includes:
  a ninth transistor, a control electrode of the ninth transistor being coupled to the first scanning signal terminal, a first electrode of the ninth transistor being coupled to the feedback node, and a second electrode of the ninth transistor being coupled to the feedback signal terminal;
the input sub-circuit includes:
  a tenth transistor, a control electrode of the tenth transistor being coupled to the first scanning signal terminal, a first electrode of the tenth transistor being coupled to the input signal terminal, and a second electrode of the tenth transistor being coupled to the fifth node;

the second driving sub-circuit includes:
  an eleventh transistor, a control electrode of the eleventh transistor being coupled to the fifth node, a first electrode of the eleventh transistor being coupled to the sixth node, and a second electrode of the eleventh transistor being coupled to the feedback node;
the third storage sub-circuit includes:
  a third capacitor, a first end of the third capacitor being coupled to the first voltage signal terminal, and a second end of the third capacitor being coupled to the fifth node; and
the modulation sub-circuit includes:
  a twelfth transistor, a control electrode of the twelfth transistor being coupled to the third scanning signal terminal, a first electrode of the twelfth transistor being coupled to the first voltage signal terminal, and a second electrode of the twelfth transistor being coupled to the sixth node.

11. The light-emitting device according to claim 1, wherein the first semiconductor pattern is electrically connected to the second semiconductor pattern; and
the first semiconductor pattern and the second semiconductor pattern are spaced apart or of a one-piece structure.

12. The light-emitting device according to claim 1, further comprising:
a substrate, wherein the first semiconductor layer is disposed on one of two opposite sides of the substrate in the thickness direction, the first semiconductor pattern and the second semiconductor pattern are disposed on a same substrate, and the light-emitting functional layer is disposed on a side of the first semiconductor layer away from the substrate.

13. A light-emitting substrate, comprising:
a driving backplane including a plurality of pixel circuits each including:
  a first control circuit coupled to a first scanning signal terminal, a first data signal terminal, a first voltage signal terminal and a first light-emitting portion of a light-emitting device, wherein the first control circuit is configured to, under control of a first scanning signal from the first scanning signal terminal and a first data signal from the first data signal terminal, control connection between the first voltage signal terminal and the first light-emitting portion, and control a luminance of the first light-emitting portion to be switched between a first gray scale and a second gray scale; and
  a second control circuit coupled to the first scanning signal terminal, the first voltage signal terminal and a second light-emitting portion of the light-emitting device, wherein the second control circuit is configured to, under control of the first scanning signal from the first scanning signal terminal, control connection between the first voltage signal terminal and the second light-emitting portion, and control a magnitude of a driving current flowing through the second light-emitting portion; and
a plurality of light-emitting devices each including:
  a first semiconductor layer including a first semiconductor pattern and a second semiconductor pattern;
  a light-emitting functional layer disposed on one of two opposite sides of the first semiconductor layer in a thickness direction of the first semiconductor layer, the light-emitting functional layer including a first light-emitting pattern and a second light-emitting pattern spaced apart;

a second semiconductor layer disposed on a side of the light-emitting functional layer away from the first semiconductor layer, the second semiconductor layer including a third semiconductor pattern and a fourth semiconductor pattern spaced apart;

an electrode layer disposed on a side of the second semiconductor layer away from the first semiconductor layer, the electrode layer including a first electrode and a second electrode spaced apart, wherein the first electrode is electrically connected to the third semiconductor pattern, and the second electrode is electrically connected the fourth semiconductor pattern; and a passivation layer disposed between the second semiconductor layer and the electrode layer, wherein the passivation layer is provided with a first via hole and a second via hole therein, the first electrode is electrically connected to the third semiconductor pattern through the first via hole, and the second electrode is electrically connected to the fourth semiconductor pattern through the second via hole;

wherein, orthographic projections of the first semiconductor pattern, the first light-emitting pattern and the third semiconductor pattern on a reference plane at least partially overlap to form the first light-emitting portion; orthographic projections of the second semiconductor pattern, the second light-emitting pattern and the fourth semiconductor pattern on the reference plane at least partially overlap to form the second light-emitting portion; and the reference plane is parallel to a plane where the first semiconductor layer is located;

wherein, the first control circuit of each pixel circuit is coupled to the first light-emitting portion of the light-emitting device, and the second control circuit of the pixel circuit is coupled to the second light-emitting portion of the light-emitting device.

14. The light-emitting substrate according to claim 13, wherein the second control circuit of the pixel circuit includes a feedback sub-circuit, an input sub-circuit, a second driving sub-circuit, a third storage sub-circuit and a modulation sub-circuit;

the feedback sub-circuit is coupled to the first scanning signal terminal, a feedback signal terminal and a feedback node; the feedback node is coupled to the second light-emitting portion;

the input sub-circuit is coupled to the first scanning signal terminal, an input signal terminal and a fifth node;

the second driving sub-circuit is coupled to the fifth node, a sixth node and the feedback node;

the third storage sub-circuit is coupled to the first voltage signal terminal and the fifth node;

the modulation sub-circuit is coupled to a third scanning signal terminal, the first voltage signal terminal and the sixth node; and the light-emitting substrate further comprises a circuit board coupled to the driving backplane, the circuit board includes a third control circuit, and the third control circuit includes:

a comparing sub-circuit, the comparing sub-circuit being coupled to a third data signal terminal, the feedback signal terminal and a seventh node, and being configured to compare a voltage of the feedback node transmitted by the feedback signal terminal with a voltage of a third data signal from the third data signal terminal, and output an adjustment voltage to the seventh node according to a comparison result; and the third data signal terminal being configured to transmit the third data signal for controlling a gray scale of the second light-emitting portion; and a signal converting sub-circuit, the signal converting sub-circuit being coupled to the seventh node, a ground voltage terminal and the input signal terminal, and being configured to transmit an input signal to the input signal terminal according to the adjustment voltage of the seventh node and a voltage of the ground voltage terminal.

15. The light-emitting substrate according to claim 14, wherein the comparing sub-circuit includes:
a first amplifier, the first amplifier including a first positive input terminal, a first negative input terminal and a first output terminal, the first positive input terminal being coupled to the feedback signal terminal, the first negative input terminal being coupled to the third data signal terminal, and the first output terminal being coupled to the seventh node;

the signal converting sub-circuit includes:
a second amplifier, the second amplifier having a second positive input terminal, a second negative input terminal and a second output terminal, the second positive input terminal being coupled to the ground voltage terminal, the second negative input terminal being coupled to the seventh node, and the second output terminal being coupled to the signal input terminal; and
a fourth capacitor, a first end of the fourth capacitor being coupled to the second negative input terminal, and a second end of the fourth capacitor being coupled to the second output terminal.

16. The light-emitting substrate according to claim 15, wherein the comparing sub-circuit further includes:
a first resistor, a first end of the first resistor being electrically connected to the first positive input terminal, and a second end of the first resistor being electrically connected to the first negative input terminal; and the signal converting sub-circuit further includes:
a second resistor, a first end of the second resistor being electrically connected to the seventh node, and a second end of the second resistor being electrically connected to the second negative input terminal; and
a third resistor, a first end of the third resistor being electrically connected to the ground voltage terminal, and a second end of the third resistor being electrically connected to the second positive input terminal.

17. A display apparatus, comprising the light-emitting substrate according to claim 13.

* * * * *